United States Patent
Baek et al.

(10) Patent No.: US 9,368,589 B2
(45) Date of Patent: Jun. 14, 2016

(54) SEMICONDUCTOR DEVICE AND SEMICONDUCTOR MODULE

(71) Applicant: SAMSUNG ELECTRONICS CO., LTD., Suwon-si, Gyeonggi-do (KR)

(72) Inventors: Sung-Kweon Baek, Hwaseong-si (KR); Gab-Jin Nam, Seoul (KR); Jin-Soak Kim, Seoul (KR); Ji-Young Min, Seocho-go (KR); Eun-Ae Chung, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 5 days.

(21) Appl. No.: 14/167,053

(22) Filed: Jan. 29, 2014

(65) Prior Publication Data

US 2014/0291755 A1 Oct. 2, 2014

(30) Foreign Application Priority Data

Apr. 1, 2013 (KR) .................. 10-2013-0035314

(51) Int. Cl.
| | |
|---|---|
| *H01L 29/66* | (2006.01) |
| *H01L 21/336* | (2006.01) |
| *H01L 29/423* | (2006.01) |
| *H01L 29/78* | (2006.01) |
| *H01L 27/108* | (2006.01) |

(52) U.S. Cl.
CPC ...... *H01L 29/4236* (2013.01); *H01L 27/10814* (2013.01); *H01L 27/10823* (2013.01); *H01L 27/10855* (2013.01); *H01L 27/10876* (2013.01); *H01L 29/7827* (2013.01)

(58) Field of Classification Search
CPC ............ H01L 29/4236; H01L 29/7827; H01L 27/108

USPC ........................... 257/330, 334; 438/259, 270
See application file for complete search history.

(56) References Cited

U.S. PATENT DOCUMENTS

| | | | |
|---|---|---|---|
| 6,492,245 B1 | 12/2002 | Liu et al. | |
| 7,033,889 B2 | 4/2006 | Hijzen et al. | |
| 8,030,197 B2 | 10/2011 | Doyle et al. | |
| 8,120,099 B2 | 2/2012 | Seo et al. | |
| 8,178,923 B2 | 5/2012 | Lin et al. | |
| 8,901,630 B2 * | 12/2014 | Huh et al. | 257/296 |
| 2006/0220087 A1 | 10/2006 | Fishburn | |
| 2007/0096202 A1 | 5/2007 | Kang et al. | |
| 2008/0061320 A1 * | 3/2008 | von Kluge et al. | 257/204 |
| 2011/0001186 A1 * | 1/2011 | Seo | H01L 21/823437 257/330 |
| 2011/0049599 A1 * | 3/2011 | Taketani | 257/302 |

(Continued)

FOREIGN PATENT DOCUMENTS

| | | |
|---|---|---|
| KR | 10-0800162 B1 | 1/2008 |
| KR | 10-2010-0132197 A | 12/2010 |
| KR | 10-2012-0045484 A | 5/2012 |

*Primary Examiner* — Moazzam Hossain
(74) *Attorney, Agent, or Firm* — Lee & Morse, P.C.

(57) ABSTRACT

A semiconductor device includes a first source/drain region and a second source/drain region disposed in an active region of a semiconductor substrate, and a gate structure crossing the active region and disposed between the first and second source/drain regions, the gate structure including a gate electrode having a first part and a second part on the first part, the gate electrode being at a lower level than an upper surface of the active region, an insulating capping pattern on the gate electrode, a gate dielectric between the gate electrode and the active region, and an empty space between the active region and the second part of the gate electrode.

25 Claims, 23 Drawing Sheets

(56) References Cited

U.S. PATENT DOCUMENTS

2011/0241106 A1   10/2011  Lee et al.
2012/0001258 A1*   1/2012  Kim .............................. 257/330
2012/0012925 A1    1/2012  Oh
2012/0235228 A1*   9/2012  Huang et al. .................. 257/330
2013/0119462 A1*   5/2013  Kye et al. ...................... 257/331
2013/0130455 A1*   5/2013  Jang .............................. 438/270

* cited by examiner

SEMICONDUCTOR DEVICE AND SEMICONDUCTOR MODULE

CROSS-REFERENCE TO RELATED APPLICATION

Korean Patent Application No. 10-2013-0035314, filed on Apr. 1, 2013, in the Korean Intellectual Property Office, and entitled: "Semiconductor Device and Semiconductor Module," is incorporated by reference herein in its entirety.

BACKGROUND

1. Field

Embodiments relate to a semiconductor device and a method of fabricating the same. Embodiments also relate to a semiconductor module and electronic system employing the semiconductor device and the method.

2. Description of Related Art

As the integration of a semiconductor device increases, gate induced drain leakage (GIDL) current characteristics in a three-dimensional transistor have a significant effect on the performance of a semiconductor device.

SUMMARY

Embodiments provide a structure of a semiconductor device in which leakage current of a transistor is reduced.

Other embodiments provide a structure of a semiconductor device in which refresh characteristics of a DRAM are improved.

Still other embodiments provide methods of fabricating the semiconductor devices.

Still other embodiments provide an electronic apparatus and electronic system including the semiconductor devices.

In accordance with embodiments, a semiconductor device includes a first source/drain region and a second source/drain region disposed in an active region of a semiconductor substrate, and a gate structure crossing the active region and disposed between the first and second source/drain regions. The gate structure includes a gate electrode having a first part and a second part disposed on the first part, and disposed at a lower level than an upper surface of the active region, an insulating capping pattern disposed on the gate electrode, a gate dielectric between the gate electrode and the active region, and an empty space between the active region and the second part of the gate electrode.

In some embodiments, the empty space may be disposed between the gate dielectric and the second part of the gate electrode.

In other embodiments, the empty space may face the first and second source/drain regions.

In still embodiments, the empty space may have a smaller width than the gate dielectric.

In still other embodiments, a distance between the active region and the second part of the gate electrode may be greater than a distance between the active region and the first part of the gate electrode.

In still other embodiments, the second part of the gate electrode may have a smaller width than the first part of the gate electrode.

In still other embodiments, the gate electrode may include a lower gate conductive pattern and an upper gate conductive pattern. The lower gate conductive pattern may be located at a lower level than an upper surface of the upper gate conductive pattern, and interposed between the upper gate conductive pattern and the gate dielectric.

In still other embodiments, the empty space may be interposed between the lower gate conductive pattern and the insulating capping pattern, and between the upper gate conductive pattern and the gate dielectric.

In still other embodiments, the lower gate conductive pattern may have substantially the same thickness as the gate dielectric.

In still other embodiments, the semiconductor device may further include an intermediate gate conductive pattern disposed between the lower gate conductive pattern and the upper gate conductive pattern.

In accordance with other embodiments, a semiconductor device includes a gate trench crossing an active region in a semiconductor substrate, a gate electrode disposed in the gate trench, an insulating capping pattern disposed on the gate electrode, a gate dielectric disposed between the gate electrode and the active region, and between the insulating capping pattern and the active region, and an empty space surrounded by the gate electrode, the insulating capping pattern, and the gate dielectric.

In some embodiments, the gate electrode may include a lower gate conductive pattern and an upper gate conductive pattern. The lower gate conductive pattern may be located at a lower level than an upper surface of the upper gate conductive pattern, and interposed between the upper gate conductive pattern and the gate dielectric.

In other embodiments, the empty space may be surrounded by the lower gate conductive pattern, the upper gate conductive pattern, the insulating capping pattern, and the gate dielectric.

In still other embodiments, the empty space may include a first part interposed between the gate dielectric and the gate electrode, and a second part interposed between the gate dielectric and the insulating capping pattern.

In still other embodiments, the gate electrode may include a first part and a second part disposed on the first part, and the first part of the empty space is interposed between the second part of the gate electrode and the gate dielectric.

In accordance with still other embodiments, a semiconductor device includes a trench isolation layer formed in a semiconductor substrate and defining an active region, a first gate trench disposed in the active region, a second gate trench disposed in the trench device isolation region, a first source/drain region and a second source/drain region formed in the active region disposed at both sides of the first gate trench, a first gate structure disposed in the first gate trench, and a second gate structure disposed in the second gate trench. The first gate structure includes a first gate electrode, a first insulating capping pattern disposed on the first gate electrode, a gate dielectric disposed between the first gate electrode and the active region, and between the first insulating capping pattern and the active region, and a first empty space disposed between the first source/drain region and the first gate electrode. The second gate structure includes a second gate electrode, a second insulating capping pattern, and a second empty space.

In some embodiments, the second insulating capping pattern may be disposed on the second gate electrode, and the second empty space may be disposed between an upper side surface of the second gate electrode and the trench isolation layer.

In other embodiments, the first gate electrode may include a first lower gate conductive pattern and a first upper gate conductive pattern, and the second gate electrode may include a second lower gate conductive pattern and a second upper gate conductive pattern. The first lower gate conductive pattern may be located at a lower level than an upper surface of the first upper gate conductive pattern, and disposed between the first upper gate conductive pattern and the gate dielectric. The second lower gate conductive pattern may be located at a lower level than an upper surface of the second upper gate conductive pattern, and disposed between the second upper gate conductive pattern and the trench isolation layer.

In still other embodiments, the first empty space may be interposed between the first lower gate conductive pattern and the first insulating capping pattern, and between the first upper gate conductive pattern and the gate dielectric.

In still other embodiments, the second empty space may be interposed between the second lower gate conductive pattern and the second insulating capping pattern, and between the second upper gate conductive pattern and the trench isolation layer.

In still other embodiments, the first source/drain region may be disposed between the first gate structure and the second gate structure, and between the first insulating capping pattern and the second insulating capping pattern.

In still other embodiments, the first empty space may be disposed between the second gate electrode and the first source/drain region, and the second empty space may be disposed between the second gate electrode and the first source/drain region.

In still other embodiments, the semiconductor device may further include an information storage element electrically connected to the first source/drain region, and a bit line structure electrically connected to the second source/drain region.

In accordance with still other embodiments, a semiconductor device includes a module substrate, and a semiconductor device disposed on the module substrate. The semiconductor device includes a trench isolation layer formed in a semiconductor substrate and defining an active region, a first source/drain region and a second source/drain region formed in the active region, a first gate structure disposed in the active region between the first and second source/drain regions, a second gate structure disposed in the trench isolation layer, an information storage element electrically connected to the first source/drain region, and a bit line structure electrically connected to the second source/drain region. The first gate structure includes a first gate electrode, a first insulating capping pattern disposed on the first gate electrode, a gate dielectric disposed between the first gate electrode and the active region, and a first empty space disposed between the first gate electrode and the gate dielectric. The second gate structure includes a second gate electrode, a second insulating capping pattern disposed on the second gate electrode, and a second empty space interposed between the second gate electrode and the trench isolation layer.

In some embodiments, the first source/drain region may be disposed between the first empty space and the second empty space.

In accordance with still other embodiments, a semiconductor device includes a first source/drain region and a second source/drain region disposed in an active region of a semiconductor substrate, and a gate structure crossing the active region and disposed between the first and second source/drain regions, the gate structure including a gate electrode having a first part and a second part on the first part, the gate electrode being at a lower level than an upper surface of the active region, an insulating capping pattern on the gate electrode, a gate dielectric between the gate electrode and the active region, and an empty space enclosed by the first part of the gate electrode, the second part of the gate electrode, the insulating capping pattern, and the gate dielectric.

The first part of the gate electrode partially may extend along sidewalls of a trench, the second part of the gate electrode being on the first part of the gate electrode inside the trench and extending above an uppermost surface of the first part of the gate electrode, and the empty space may be between the sidewall of the trench and a portion of the second part of the gate electrode that extends above the first part of the gate electrode.

A portion of the gate dielectric may be directly between the sidewall of the trench and the empty space.

The first part of the gate electrode may conformally overlap a lower portion of the second part of the gate electrode, the empty space being defined on the first part of the gate electrode and along an upper portion of the second part of the gate electrode.

A width of the first part of the gate electrode may equal a width of the empty space, the empty space being directly above the first part of the gate electrode.

BRIEF DESCRIPTION OF THE DRAWINGS

The foregoing and other features will be apparent from the more particular description of preferred embodiments, as illustrated in the accompanying drawings in which like reference characters refer like elements throughout. The drawings are not necessarily to scale. In the drawings.

DETAILED DESCRIPTION

Figure 1:
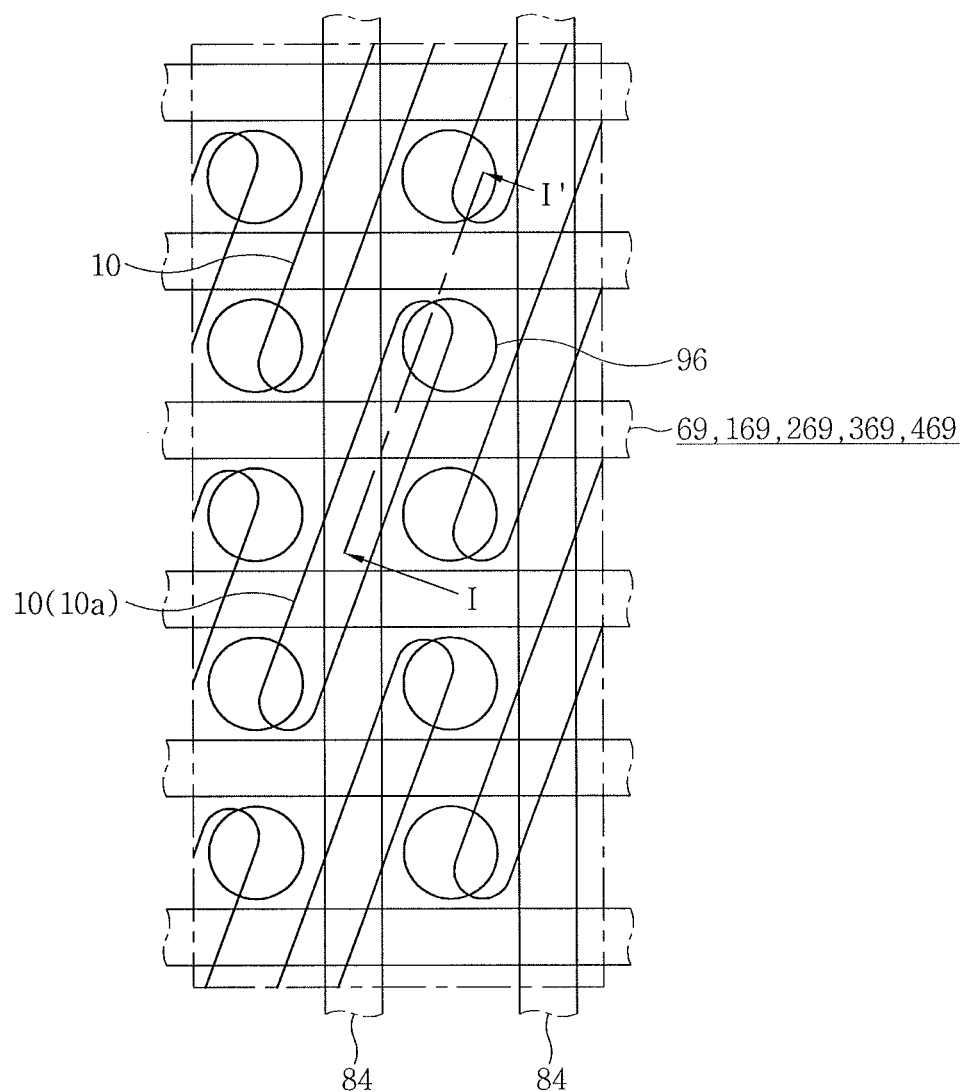
FIG. 1 illustrates a plan view of a semiconductor device in accordance with an embodiment.

Various embodiments will now be described more fully with reference to the accompanying drawings in which some embodiments are shown. These embodiments may, however, be embodied in different forms and should not be construed as limited to the embodiments set forth herein. Rather, these embodiments are provided so that this disclosure is thorough and complete and fully conveys exemplary implementations to those skilled in the art. In the drawings, the sizes and relative sizes of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

It will be understood that, although the terms first, second, A, B, etc. may be used herein in reference to elements of embodiments, such elements should not be construed as limited by these terms. For example, a first element could be termed a second element, and a second element could be termed a first element, without departing from the scope of the embodiments. Herein, the term "and/or" includes any and all combinations of one or more referents. Also, the term "empty space" may refer to a space which is surrounded by components consisting of solid materials but not filled with the solid material. For example, the empty space may be filled with a gas or air instead of the solid material. For example, the empty space may be an "air gap" or an "air space".

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly. The terminology used herein to describe embodiments is not intended to limit the scope of the embodiments. The articles "a," "an," and "the" are singular in that they have a single referent, however the use of the singular form in the present document should not preclude the presence of more than one referent. In other words, elements referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

Unless otherwise defined, all terms (including technical and scientific terms) used herein are to be interpreted as is customary in the art. It will be further understood that terms in common usage should also be interpreted as is customary in the relevant art and not in an idealized or overly formal sense unless expressly so defined herein.

Figure 2A:
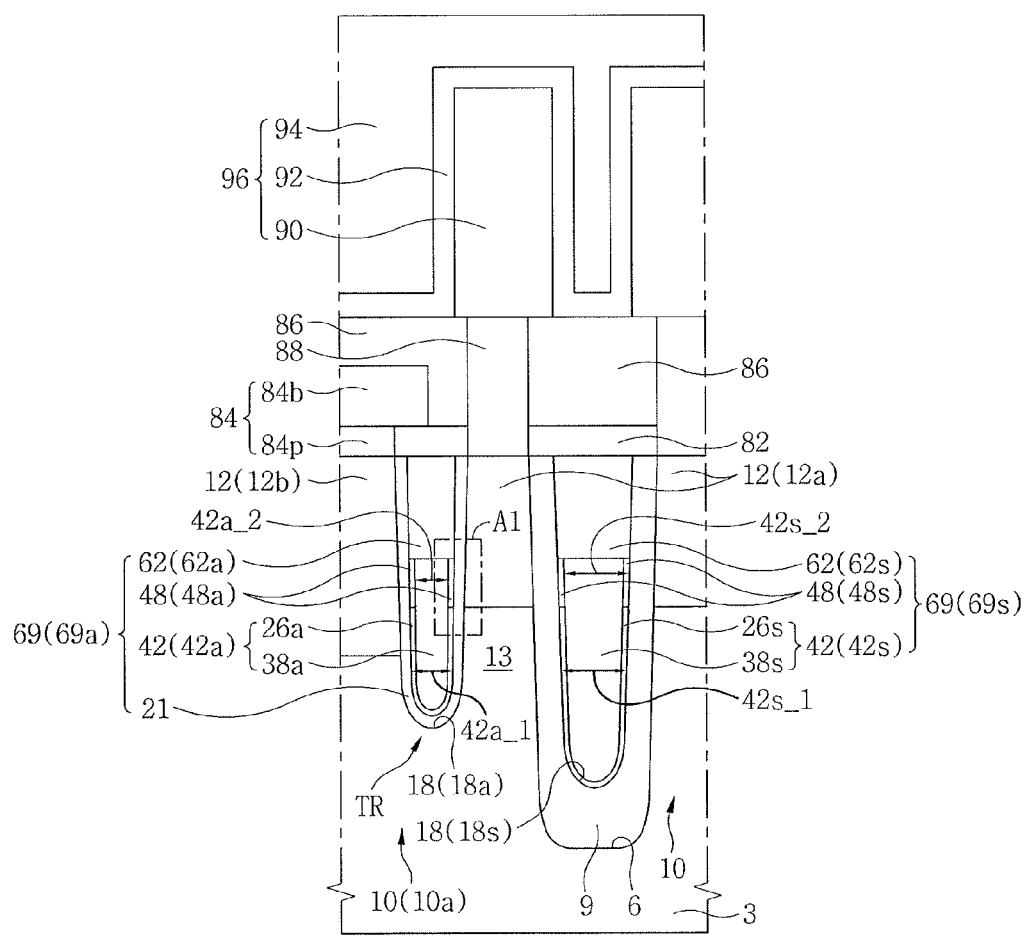
FIG. 2A illustrates a cross-sectional view of a semiconductor device in accordance with an embodiment.
Figure 3:
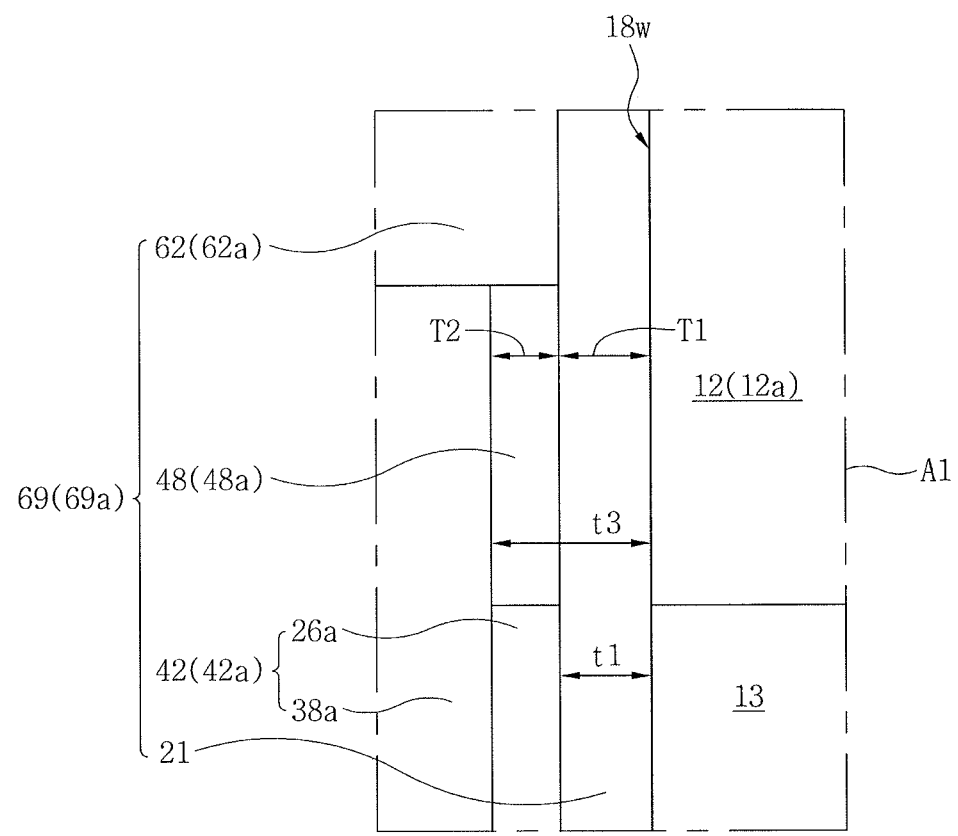
FIG. 3 illustrates an enlarged view of area "A1" in FIG. 2A.

First, a semiconductor device in accordance with an embodiment will be described with reference to FIGS. 1, 2A, and 3. FIG. 1 illustrates a plan view of a semiconductor device in accordance with embodiments, and FIG. 2A illustrates a cross-sectional view along line I-I' of FIG. 1. FIG. 3 illustrates an enlarged view of area "A1" in FIG. 2A.

Referring to FIGS. 1, 2A, and 3, a semiconductor substrate 3 may be provided. A trench isolation layer 9 defining a plurality of active regions 10 may be disposed in the semiconductor substrate 3. The trench isolation layer 9 may include an insulating material layer filling a field trench 6 in the semiconductor substrate 3.

Figure 2B:
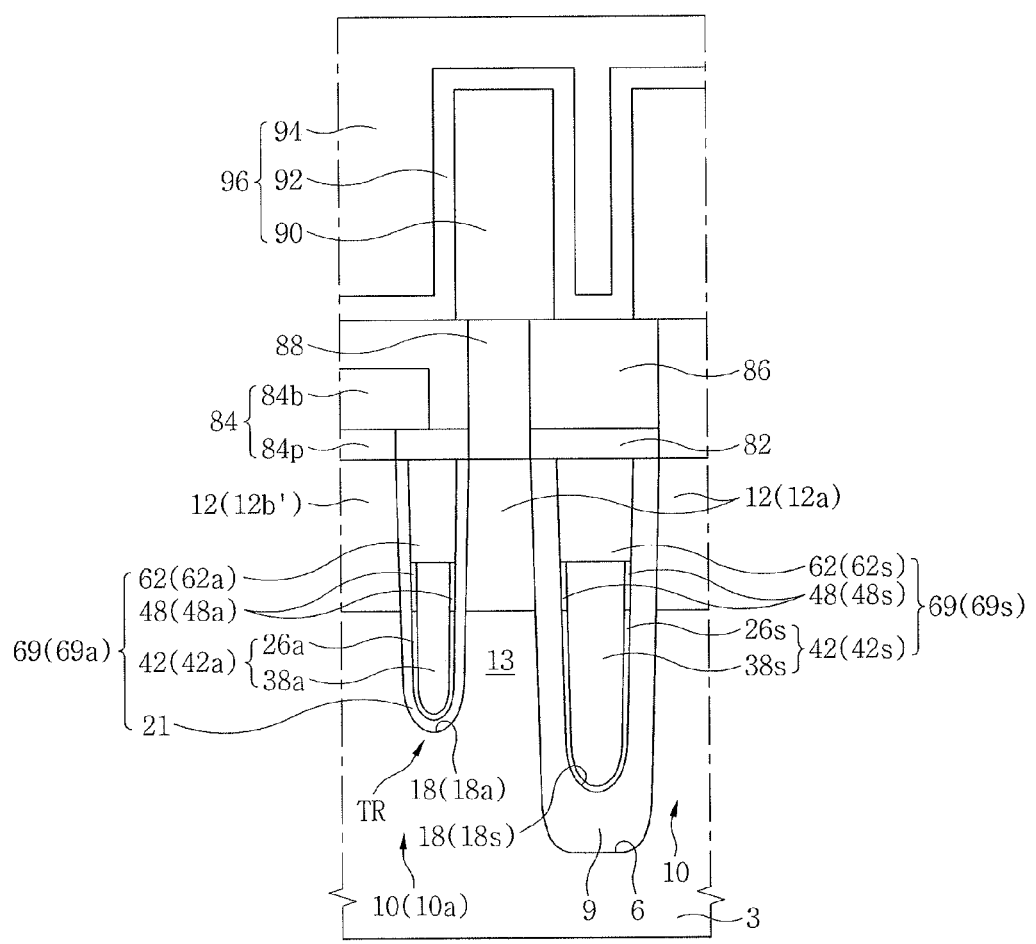
FIG. 2B illustrates a cross-sectional view of a modified example of a semiconductor device in accordance with an embodiment.

Source/drain regions 12 may be disposed in the active regions 10. The source/drain regions 12 may include asymmetrically structured first and second source/drain regions 12a and 12b. For example, the first source/drain region 12a may have a shallow junction structure compared to the second source/drain region 12b. However, embodiments are not limited thereto. For example, as shown in FIG. 2B, the source/drain regions 12 may include symmetrically structured first and second source/drain regions 12a and 12b'.

Gate trenches 18 crossing the active regions 10 and extending into the trench isolation layer 9 may be disposed. Gate structures 69 may be disposed in the gate trenches 18. The gate structures 69 may be disposed in the active regions 10 between the source/drain regions 12, and extend into the trench isolation layer 9. In the gate structures 69, a bottom surface of a part disposed in the trench isolation layer 9 may be located at a lower level than that disposed in the active regions 10.

Each of the gate structures 69 may include a gate dielectric 21, a gate electrode 42, an insulating capping pattern 62, and an empty space 48. The gate electrode 42 may be disposed in the gate trench 18, and located at a lower level than upper surfaces of the active regions 10. The insulating capping pattern 62 may be disposed on the gate electrode 42. The gate dielectric 21 may be disposed between the active region 10 and the gate electrode 42, and between the active region 10 and the insulating capping pattern 62. The empty space 48 may be disposed on an upper side surface of the gate electrode 42. The empty space 48 may be disposed between the upper side surface of the gate electrode 42 and a sidewall of the gate trench 18.

In some embodiments, the "empty space 48" refers to a space which is surrounded by components consisting of solid materials, without being filled with the solid material. For example, the empty space 48 may be filled with gas or air instead of the solid material. For example, the empty space 48 may be filled with gas used in a deposition process for forming the insulating capping pattern 62.

The gate structures 69 may include first and second gate structures 69a and 69s parallel to each other. The first gate structure 69a may cross an active region 10a among the active regions 10, and the second gate structure 69s may be disposed in the trench isolation layer 9 adjacent to the active region 10a.

The first gate structure 69a may be disposed in a first gate trench 18a crossing the active region 10a. The first gate structure 69a may include the gate dielectric 21, a first gate electrode 42a, a first insulating capping pattern 62a, and a first empty space 48a. The second gate structure 69s may be disposed in a second gate trench 18s in the trench isolation layer 9. The second gate structure 69s may include a second gate electrode 42s, a second insulating capping pattern 62s, and a second empty space 48s.

The first gate electrode 42a may include a first part 42a_1, and a second part 42a_2 disposed on the first part 42a_1. The width of the second part 42a_2 of the first gate electrode 42a may be smaller than that of the first part 42a_1 of the first gate electrode 42a. The second gate electrode 42s may include a first part 42s_1, and a second part 42s_2 disposed on the first part 42s_1. The width of the second part 42s_2 of the second gate electrode 42s may be smaller than that of the first part 42s_1 of the second gate electrode 42s.

The first gate electrode 42a may include a first lower gate conductive pattern 26a and a first upper gate conductive pattern 38a. The first lower gate conductive pattern 26a may surround a bottom surface and a part of a side surface of the first upper gate conductive pattern 38a, and may be disposed at a lower level than an upper surface of the first upper gate conductive pattern 38a. The first lower gate conductive pattern 26a may be disposed at the first part 42a_1 of the first gate electrode 42a. The second gate electrode 42s may include a second lower gate conductive pattern 26s and a second upper gate conductive pattern 38s. The second lower gate conductive pattern 26s may surround a bottom surface and a part of a side surface of the second upper gate conductive pattern 38s, and may be disposed at a lower level than an upper surface of the second upper gate conductive pattern 38s.

The first and second gate electrodes 42a and 42s may be formed of the same material. The first and second upper gate conductive patterns 38a and 38s may include a conductive material having a lower resistivity than the first and second lower gate conductive patterns 26a and 26s. For example, the first and second lower gate conductive patterns 26a and 26s may include a metal nitride, e.g., TiN, WN, TiSiN, and TaN, and the first and second upper gate conductive patterns 38a and 38s may include a metal material, e.g., W.

The first insulating capping pattern 62a may be disposed on the first gate electrode 42a, and the second insulating capping pattern 62s may be disposed on the second gate electrode 42s. The first and second insulating capping patterns 62a and 62s may be formed of an insulating material, e.g., silicon nitride, silicon oxynitride (SiON), and silicon oxide.

The gate dielectric 21 may be disposed between the first gate electrode 42a and the active region 10a, and between the first insulating capping pattern 62a and the active region 10a. The gate dielectric 21 may be formed by a thermal oxidation process. For example, the gate dielectric 21 may include silicon oxide formed by a thermal oxidation process. However, embodiments are not limited thereto. For example, according to the embodiments, the gate dielectric 21 may include an oxide formed by a process, e.g., an atomic layer deposition (ALD) process, as well as an oxide formed by thermally oxidizing the active region 10a.

The empty space 48 may include a first empty space 48a and a second empty space 48s.

The first empty space 48a may be interposed between the second part 42a_2 of the first gate electrode 42a and the gate dielectric 21, and between the first lower gate conductive pattern 26a of the first gate electrode 42a and the first insulating capping pattern 62a. The first empty space 48a may be interposed between the first upper gate conductive pattern 38a and the gate dielectric 21. The first empty space 48a may be defined by the gate dielectric 21, the first insulating capping pattern 62a, the first lower gate conductive pattern 26a, and the first upper gate conductive pattern 38a.

Referring to FIG. 3, a thickness T2 of the first empty space 48a may be smaller than a thickness T1 of the gate dielectric 21. The thickness T2 of the first empty space 48a may be substantially the same as that of the first lower gate conductive pattern 26a.

In some embodiments, "thickness" may refer to a dimension in a perpendicular direction to the sidewall 18w of the gate trench 18. For example, the thickness T1 of the gate dielectric 21 may be a dimension in a perpendicular direction to the sidewall 18w of the gate trench 18.

The second empty space 48s may be interposed between the second part 42s_2 of the second gate electrode 42s and the trench isolation layer 9, and between the second lower gate conductive pattern 26s of the second gate electrode 42s and the second insulating capping pattern 62s. The second empty space 48s may be interposed between the second upper gate conductive pattern 38s and the trench isolation layer 9. The second empty space 48s may be defined by the trench isolation layer 9, the second insulating capping pattern 62s, the second lower gate conductive pattern 26s, and the second upper gate conductive pattern 38s.

Parts of the active region 10 located under the source/drain regions 12 and adjacent to the gate structures 69 may be defined as channel areas 13 of transistors. Accordingly, the source/drain regions 12, the gate structures 69, and the channel areas 13 may configure transistors TR. The transistor TR may be a cell transistor of a memory device, e.g., a DRAM. The first source/drain region 12a among the source/drain regions 12 may be disposed between the first gate structure 69a and the second gate structure 69s.

A lower insulating layer 82 may be disposed on the substrate having the gate structures 69.

A bit line structure 84 electrically connected to the second source/drain region 12b may be disposed on the lower insulating layer 82. The bit line structure 84 may include a bit line plug 84p passing through the lower insulating layer 82 and physically connected to the second source/drain region 12b, and a bit line 84b formed on the lower insulating layer 82 and overlapping the bit line plug 84p. The bit line 84b may have a direction intersecting the gate structures 69.

An upper insulating layer 86 may be disposed on the substrate having the bit line structure 84. A contact structure 88 passing through the upper insulating layer 86 and electrically connected to the first source/drain region 12a may be formed. The contact structure 88 may be formed of a conductive material, e.g., a doped polysilicon, a metal, and a metal nitride.

An information storage element 96 electrically connected to the contact structure 88 may be formed on the upper insulating layer 86. The information storage element 96 may be a capacitor of a memory device, e.g., a DRAM. For example, the information storage element 96 may include a first electrode 90 electrically connected to the contact structure 88, a storage dielectric 92 disposed on the first electrode 90, and a second electrode 94 disposed on the storage dielectric 92. The first electrode 90 may be electrically connected to the first source/drain region 12a through the contact structure 88.

The first and second source/drain regions 12a and 12b and the first gate structure 69a may configure a transistor TR. The first source/drain region 12a of the transistor may be electrically connected to the information storage element 96, and the second source/drain region 12b may be electrically connected to the bit line structure 84.

The gate dielectric 21 having the thickness T1 may be interposed between the first gate electrode 42a and the channel area 13. The gate dielectric 21 with the thickness T1 and the first empty space 48a having the thickness T2 may be interposed between the first gate electrode 42a and the first source/drain region 12a. That is, referring to FIG. 3, a distance t1 between the first gate electrode 42a and the channel area 13 may be smaller than a distance t3 between the first gate electrode 42a and the first source/drain region 12a. It is noted that the distance t1 corresponds, e.g., equals, to the thickness T1 of the gate dielectric 21, and the distance t3 corresponds, e.g., equals, to the sum of thicknesses T1 and T2.

The first empty space 48a may be filled with gas, e.g., air, and the gate dielectric 21 may be formed of a material layer, e.g., silicon oxide. Accordingly, due to the first empty space 48a having a lower dielectric constant than the gate dielectric 21, an effective oxide thickness (EOT) at a region at which the first gate electrode 42a and the first source/drain region 12a face each other may be greater than a physical oxide thickness at the same region. In other words, while the physical oxide thickness between the first gate electrode 42a and the first source/drain region 12a equals the sum of thicknesses T1 and T2, i.e., the distance t3, the first empty space 48a positioned between the gate dielectric 21 and the first gate electrode 42a makes the effective oxide thickness between the first gate electrode 42a and the first source/drain region 12a be larger than the distance t3.

Accordingly, since the first empty space 48a is arranged with the gate dielectric 21 between the first gate electrode 42a and the first source/drain region 12a, leakage current generated by the first gate electrode 42a at the source/drain region 12a may be suppressed. The first empty space 48a may suppress a gate induced drain leakage (GIDL) current at the first source/drain region 12a.

The gate structure 69 may suppress the GIDL current of the transistor TR. By providing a cell transistor of a DRAM device employing the gate structure 69, refresh characteristics of the DRAM device may be improved.

The structure of the gate structure 69 in accordance with an embodiment may not be limited to the form described in FIGS. 2A and 3. Hereinafter, semiconductor devices including modified examples of the gate structure 69 will be described with reference to FIGS. 4A and 4B, 5, 6A and 6B, 7A and 7B, and 8. The semiconductor devices may include the active region 10, the trench isolation layer 9, the source/drain regions 12, the channel area 13, the gate trench 18, the bit line structure 84, and the information storage element 96, as described with reference to FIG. 2A. Hereinafter, a detailed explanation about the active region 10, the trench isolation layer 9, the source/drain regions 12, the channel area 13, the gate trench 18, the bit line structure 84, and the information storage element 96 will be omitted.

Figure 4A:
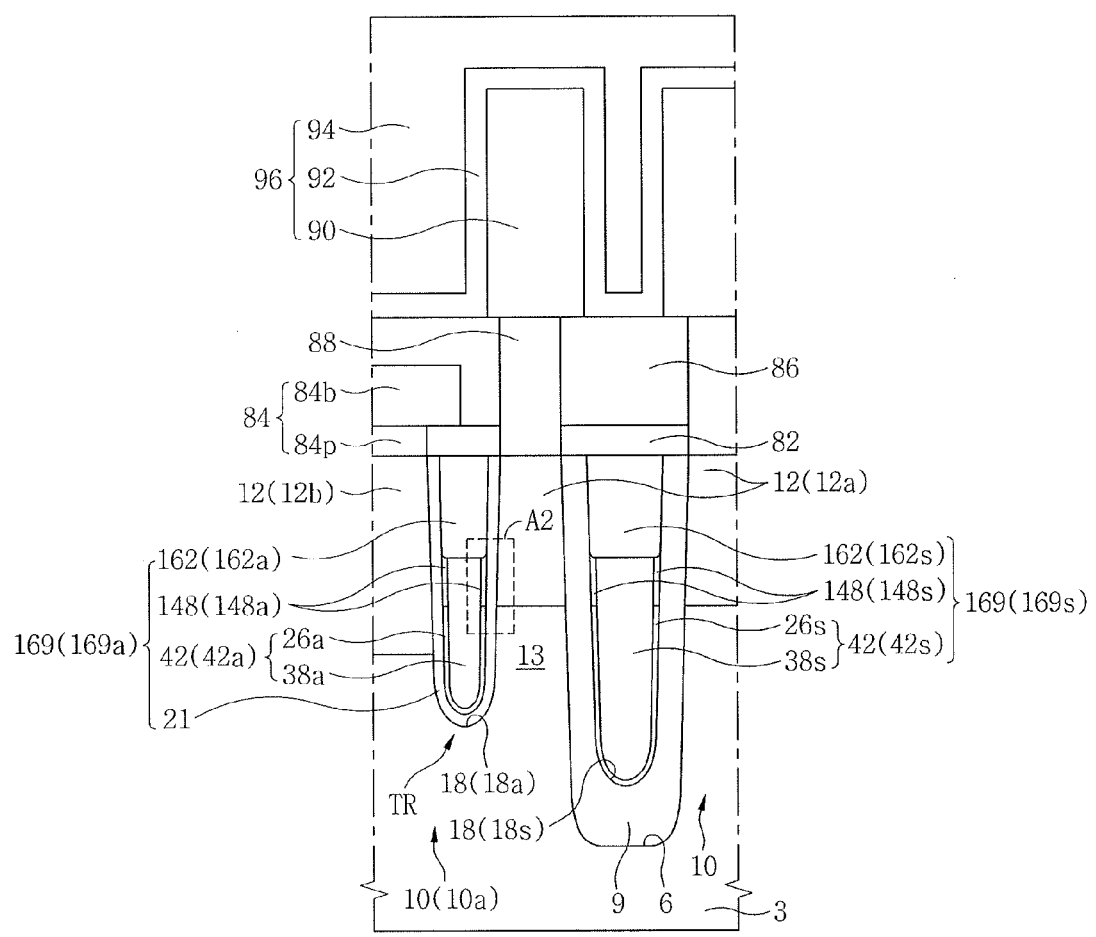
FIGS. 4A and 4B illustrate cross-sectional views of another modified example of a semiconductor device in accordance with an embodiment.

First, with reference to FIGS. 4A and 4B, a semiconductor device including a modified example of the gate structure (reference numeral 69 in FIG. 2A) will be described. FIG. 4A illustrates a cross-sectional view of an area taken along line I-I' of FIG. 1, and FIG. 4B illustrates a partially enlarged view showing area "A2" in FIG. 4A.

Figure 4B:
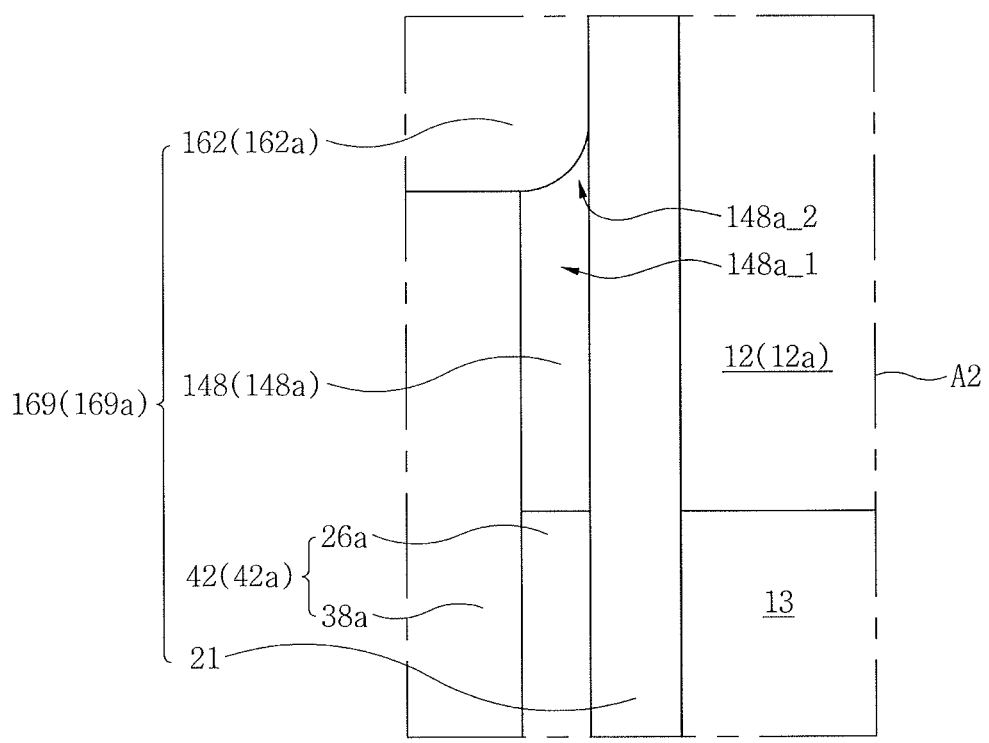

Referring to FIGS. 4A and 4B, a gate structure 169 may be disposed in the gate trench 18. The gate structure 169 may include the gate dielectric 21, the gate electrode 42, an insulating capping pattern 162, and an empty space 148. The insulating capping pattern 162 may be disposed on the gate electrode 42. The gate dielectric 21 may be disposed between the gate electrode 42 and the active region 10, and between the insulating capping pattern 162 and the active region 10. The empty space 148 may be disposed on an upper side surface of the gate electrode 42.

The gate trench 18, as described in reference to FIG. 2A, may include the first gate trench 18a in the active region 10a, and the second gate trench 18s in the trench isolation layer 9. The gate structure 169 may include a first gate structure 169a of the first gate trench 18a, and a second gate structure 169s in the second gate trench 18s.

The first gate structure 169a may include the gate dielectric 21, the first gate electrode 42a, a first insulating capping pattern 162a, and a first empty space 148a. The second gate structure 169s may include the second gate electrode 42s, a second insulating capping pattern 162s, and a second empty space 148s.

The first gate electrode 42a, as described in reference to FIG. 2A, may include the first upper gate conductive pattern 38a and the first lower gate conductive pattern 26a surrounding a bottom surface and a part of a side surface of the first upper gate conductive pattern 38a. The second gate electrode 42s, as described in reference to FIG. 2A, may include the second upper gate conductive pattern 38s and the second lower gate conductive pattern 26s surrounding a bottom surface and a part of a side surface of the second upper gate conductive pattern 38s.

The first insulating capping pattern 162a may be disposed on the first gate electrode 42a, and the second insulating capping pattern 162s may be disposed on the second gate electrode 42s. The gate dielectric 21 may be disposed between the first gate electrode 42a and the active region 10a, and between the first insulating capping pattern 162a and the active region 10a.

The first empty space 148a may be defined by being surrounded, e.g., enclosed, by the first gate electrode 42a, the gate dielectric 21, and the first insulating capping pattern 162a. The second empty space 148s may be surrounded, e.g., enclosed, by the trench isolation layer 9, the second insulating capping pattern 162s, the second lower gate conductive pattern 26s, and the second upper gate conductive pattern 38s.

The first empty space 148a may include a first part 148a_1 disposed between the first gate electrode 42a and the active region 10a, and a second part 148a_2 disposed between the first insulating capping pattern 162a and the active region 10a. The first empty space 148a may face the source/drain regions 12 of the active region 10a. The first part 148a_1 of the first empty space 148a may be interposed between the first gate electrode 42a and the gate dielectric 21, and the second part 148a_2 of the first empty space 148a may be interposed between the first insulating capping pattern 162a and the gate dielectric 21. The second empty space 148s may include a first part interposed between the second gate electrode 42s and the trench isolation layer 9, and a second part interposed between the second insulating capping pattern 162s and the trench isolation layer 9.

The first empty space 148a may suppress a leakage current generated by the first gate electrode 42a in the first source/ drain region 12a. In addition, the second empty space 148s may suppress a leakage current generated by the second gate electrode 42s in the first source/drain region 12a.

Figure 5:
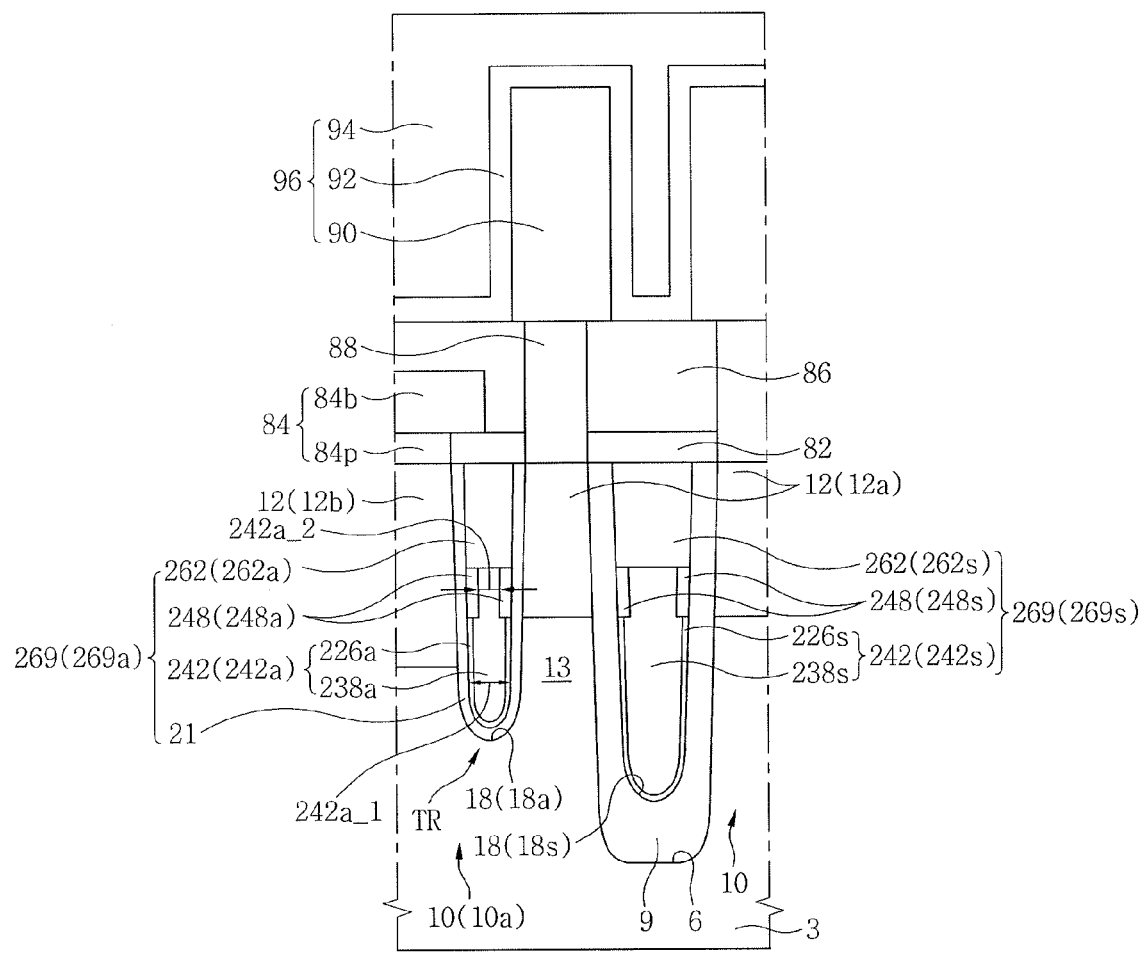
FIG. 5 illustrates a cross-sectional view of still another modified example of a semiconductor device in accordance with an embodiment.

Referring to FIG. 5, a semiconductor device including another modified example of the gate structure (reference numeral 69 in FIG. 2A) will be described. FIG. 5 illustrates a cross-sectional view of an area taken along line I-I' of FIG. 1.

Referring to FIGS. 1 and 5, a gate structure 269 may be disposed in the gate trench 18. The gate structure 269 may include the gate dielectric 21, a gate electrode 242, an insulating capping pattern 262, and an empty space 248. The insulating capping pattern 262 may be disposed on the gate electrode 242. The gate dielectric 21 may be disposed between the gate electrode 242 and the active region 10, and between the insulating capping pattern 262 and the active region 10. The empty space 248 may be disposed on an upper side surface of the gate electrode 242.

The gate trench 18, as described in reference to FIG. 2A, may include the first gate trench 18a in the active region 10a, and the second gate trench 18s in the trench isolation layer 9. The gate structure 269 may include a first gate structure 269a in the first gate trench 18a, and a second gate structure 269s in the second gate trench 18s.

The first gate structure 269a may include the gate dielectric 21, a first gate electrode 242a, a first insulating capping pattern 262a, and a first empty space 248a. The second gate structure 269s may include a second gate electrode 242s, a second insulating capping pattern 262s, and a second empty space 248s.

The first gate electrode 242a may include a first part 242a_1, and a second part 242a_2 disposed on the first part 242a 1. The width of the second part 242a_2 of the first gate electrode 242a may be smaller than that of the first part 242a_1 of the first gate electrode 242a. The first gate electrode 242a may include a first lower gate conductive pattern 226a and a first upper gate conductive pattern 238a. The first lower gate conductive pattern 226a may surround a bottom surface and a part of a side surface of the first upper gate conductive pattern 238a, and may be disposed at a lower level than an upper surface of the first upper gate conductive pattern 238a.

The second gate electrode 242s may include a second lower gate conductive pattern 226s and a second upper gate conductive pattern 238s. The second lower gate conductive pattern 226s may surround a bottom surface and a part of a side surface of the second upper gate conductive pattern 238s, and may be disposed at a lower level than an upper surface of the second upper gate conductive pattern 238s.

The first insulating capping pattern 262a may be disposed on the first gate electrode 242a, and the second insulating capping pattern 262s may be disposed on the second gate electrode 242s. The gate dielectric 21 may be disposed between the first gate electrode 242a and the active region 10a, and between the first insulating capping pattern 262a and the active region 10a.

The first empty space 248a may be disposed between the first upper gate conductive pattern 238a and the gate dielectric 21, and between the first lower gate conductive pattern 226a and the first insulating capping pattern 262a. The second empty space 248s may be disposed between the second upper gate conductive pattern 238s and the trench isolation layer 9, and between the second lower gate conductive pattern 226s and the second insulating capping pattern 262s.

A thickness of the first empty space 248a may be greater than that of the first lower gate conductive pattern 226a, and a thickness of the second empty space 248s may be greater than that of the second lower gate conductive pattern 226s.

Here, "thickness" refers to a thickness in a perpendicular direction to an inner wall of the gate trench 18, i.e., a distance along a normal to the inner wall of the gate trench 18.

Figure 6A:
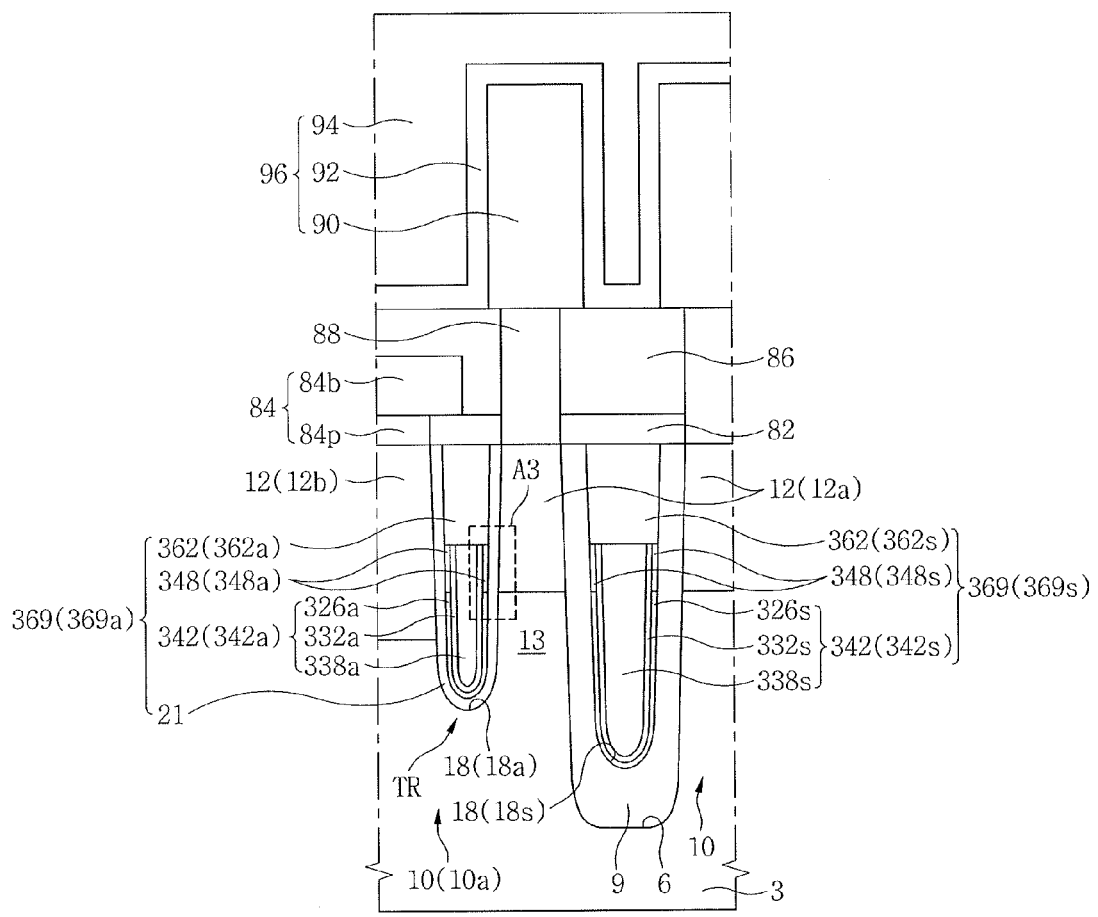
FIGS. 6A and 6B illustrate views of still another modified example of a semiconductor device in accordance with an embodiment.
Figure 6B:
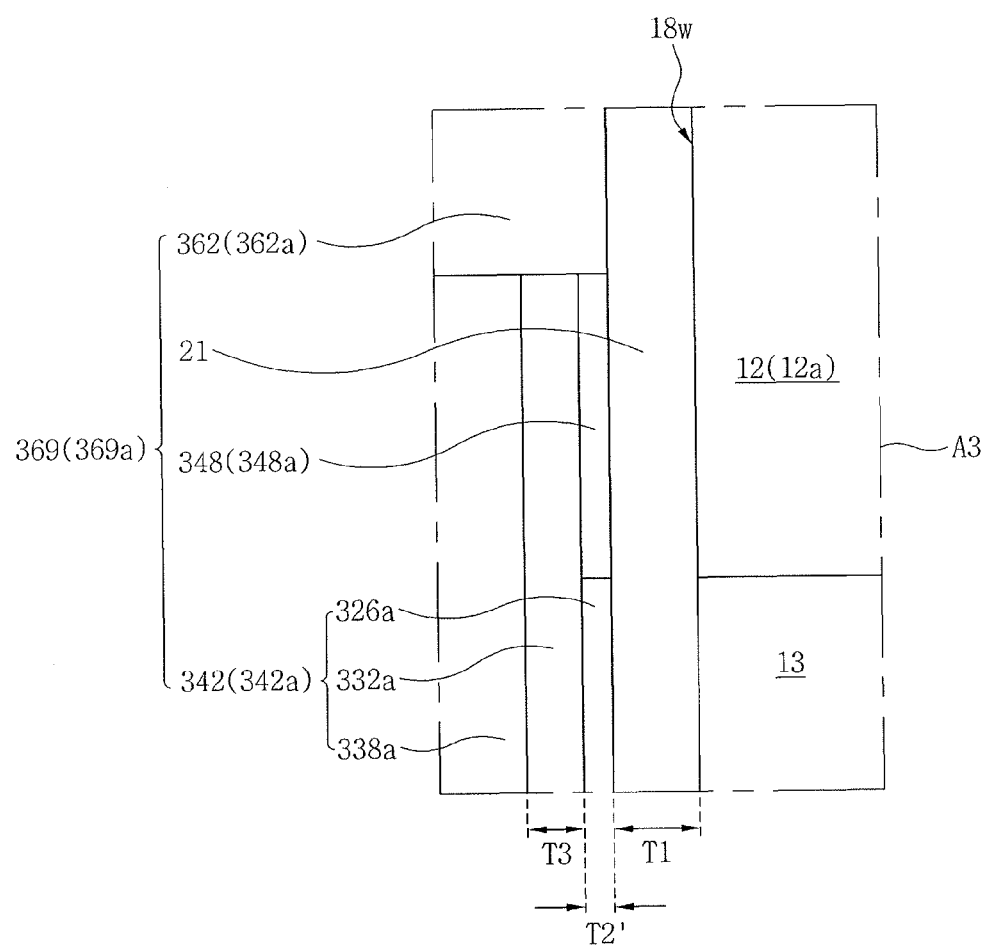

With reference to FIGS. 6A and 6B, a semiconductor device including still another modified example of the gate structure (reference numeral 69 in FIG. 2A) will be described. FIG. 6A illustrates a cross-sectional view along line I-I' of FIG. 1, and FIG. 6B illustrates a partially enlarged view of area "A3" in FIG. 6A.

Referring to FIGS. 1, 6A, and 6B, a gate structure 369 may be disposed in the gate trench 18. The gate structure 369 may include the gate dielectric 21, a gate electrode 342, an insulating capping pattern 362, and an empty space 348. The insulating capping pattern 362 may be disposed on the gate electrode 342. The gate dielectric 21 may be disposed between the gate electrode 342 and the active region 10, and between the insulating capping pattern 362 and the active region 10. The empty space 348 may be disposed on an upper side surface of the gate electrode 342.

The gate trench 18, as described in reference to FIG. 2A, may include the first gate trench 18a in the active region 10a, and the second gate trench 18s in the trench isolation layer 9. The gate structure 369 may include a first gate structure 369a in the first gate trench 18a, and a second gate structure 369s in the second gate trench 18s.

The first gate structure 369a may include the gate dielectric 21, a first gate electrode 342a, a first insulating capping pattern 362a, and a first empty space 348a. The second gate structure 369s may include a second gate electrode 342s, a second insulating capping pattern 362s, and a second empty space 348s.

The first gate electrode 342a may include a first lower gate conductive pattern 326a, a first intermediate gate conductive pattern 332a, and a first upper gate conductive pattern 338a. The second gate electrode 342s may include a second lower gate conductive pattern 326s, a second intermediate gate conductive pattern 322s, and a second upper gate conductive pattern 338s.

The first lower gate conductive pattern 326a may surround a bottom surface and a part of a side surface of the first upper gate conductive pattern 338a. The first intermediate gate conductive pattern 332a may surround the bottom and side surfaces of the first upper gate conductive pattern 338a, and may be interposed between the first lower gate conductive pattern 326a and the first upper gate conductive pattern 338a.

The second lower gate conductive pattern 326s may surround a bottom surface and a part of a side surface of the second upper gate conductive pattern 338s. The second intermediate gate conductive pattern 322s may surround the bottom and side surfaces of the second upper gate conductive pattern 338s, and may be interposed between the second lower gate conductive pattern 326s and the second upper gate conductive pattern 338s.

The first insulating capping pattern 362a may be disposed on the first gate electrode 342a, and the second insulating capping pattern 362s may be disposed on the second gate electrode 342s. The gate dielectric 21 may be disposed between the first gate electrode 342a and the active region 10a, and between the first insulating capping pattern 362a and the active region 10a.

The first empty space 348a may be surrounded by the first gate electrode 342a, the gate dielectric 21, and the first insulating capping pattern 362a. The first empty space 348a may be disposed between the first intermediate gate conductive pattern 332a and the gate dielectric 21, and between the first lower gate conductive pattern 326a and the first insulating capping pattern 362a.

The second empty space 348s may be surrounded by the second gate electrode 342s, a sidewall of the second gate trench 18s, and the second insulating capping pattern 362s. The second empty space 348s may be disposed between the second intermediate gate conductive pattern 322s and the trench isolation layer 9, and between the second lower gate conductive pattern 326s and the second insulating capping pattern 362s.

A thickness T2' of the first empty space 348a may be smaller than the thickness T1 of the gate dielectric 21. The thickness T2' of the first empty space 348a may be smaller than a thickness T3 of the first intermediate gate conductive pattern 332a. Here, "thickness" refers to a thickness in a perpendicular direction to the sidewall 18w of the gate trench 18.

Figure 7:
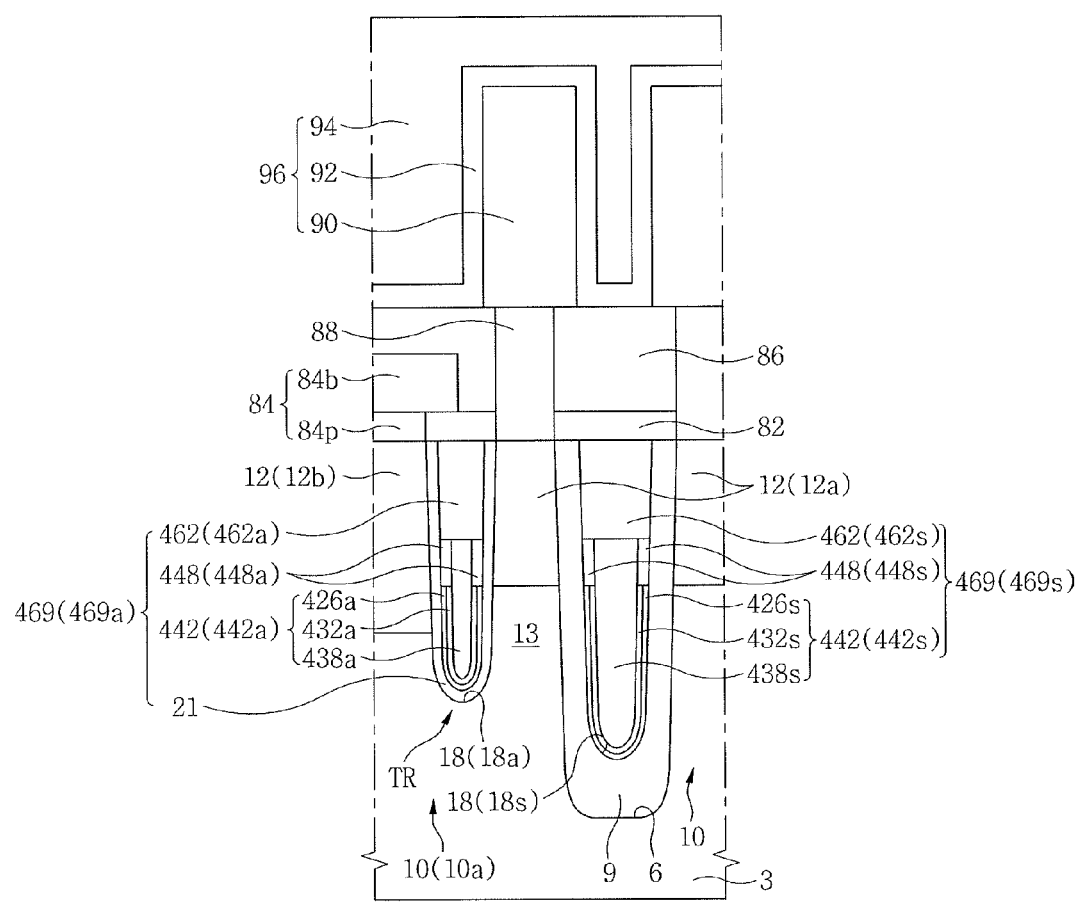
FIG. 7 illustrates a view showing still another modified example of a semiconductor device in accordance with an embodiment.

A semiconductor device including still another modified example of the gate structure (reference numeral 69 in FIG. 2A) will be described with reference to FIG. 7. FIG. 7 illustrates a cross-sectional view of an area taken along line I-I' of FIG. 1.

Referring to FIGS. 1 and 7, a gate structure 369 may be disposed in the gate trench 18. The gate structure 369 may include the gate dielectric 21, a gate electrode 442, an insulating capping pattern 462, and an empty space 448. The insulating capping pattern 462 may be disposed on the gate electrode 442. The gate dielectric 21 may be disposed between the gate electrode 442 and the active region 10, and between the insulating capping pattern 462 and the active region 10. The empty space 448 may be disposed on an upper side surface of the gate electrode 442.

The gate trench 18, as described in reference to FIG. 2A, may include the first gate trench 18a in the active region 10a, and the second gate trench 18s in the trench isolation layer 9. The gate structure 469 may include a first gate structure 469a in the first gate trench 18a, and a second gate structure 469s in the second gate trench 18s.

The first gate structure 469a may include the gate dielectric 21, a first gate electrode 442a, a first insulating capping pattern 462a, and a first empty space 448a. The second gate structure 469s may include a second gate electrode 442s, a second insulating capping pattern 462s, and a second empty space 448s.

The first gate electrode 442a may include a first lower gate conductive pattern 426a, a first intermediate gate conductive pattern 432a, and a first upper gate conductive pattern 438a. The second gate electrode 442s may include a second lower gate conductive pattern 426s, a second intermediate gate conductive pattern 432s, and a second upper gate conductive pattern 438s.

The first lower gate conductive pattern 426a may surround a bottom surface and a part of a side surface of the first upper gate conductive pattern 438a. The first intermediate gate conductive pattern 432a may be interposed between the first upper gate conductive pattern 438a and the first lower gate conductive pattern 326a. The second lower gate conductive pattern 426s may surround a bottom surface and a part of a side surface of the second upper gate conductive pattern 438s. The second intermediate gate conductive pattern 432s may be interposed between the second upper gate conductive pattern 438s and the second lower gate conductive pattern 326s.

The first insulating capping pattern 462a may be disposed on the first gate electrode 442a, and the second insulating capping pattern 462s may be disposed on the second gate electrode 442s. The gate dielectric 21 may be disposed between the first gate electrode 442a and the active region 10a, and between the first insulating capping pattern 462a and the active region 10a.

The first empty space 448a may be surrounded by the first gate electrode 442a, the gate dielectric 21, and the first insulating capping pattern 462a. The first empty space 448a may be disposed between the first upper gate conductive pattern 438a and the gate dielectric 21, and between the first lower and intermediate gate conductive patterns 426a and 432a and the first insulating capping pattern 462a.

The second empty space 448s may be surrounded by the second gate electrode 442s, a sidewall of the second gate trench 18s, and the second insulating capping pattern 462s. The second empty space 448s may be disposed between the second upper gate conductive pattern 338s and the trench isolation layer 9, and between the second lower and intermediate gate conductive patterns 426s and 432s and the second insulating capping pattern 462s.

A thickness of the first empty space 448a may be greater than that of the first lower gate conductive pattern 426a. The thickness of the first empty space 448a may be greater than that of the first intermediate gate conductive pattern 432a. Here, "thickness" refers to a thickness in a perpendicular direction to the inner wall of the gate trench 18.

Figure 8:
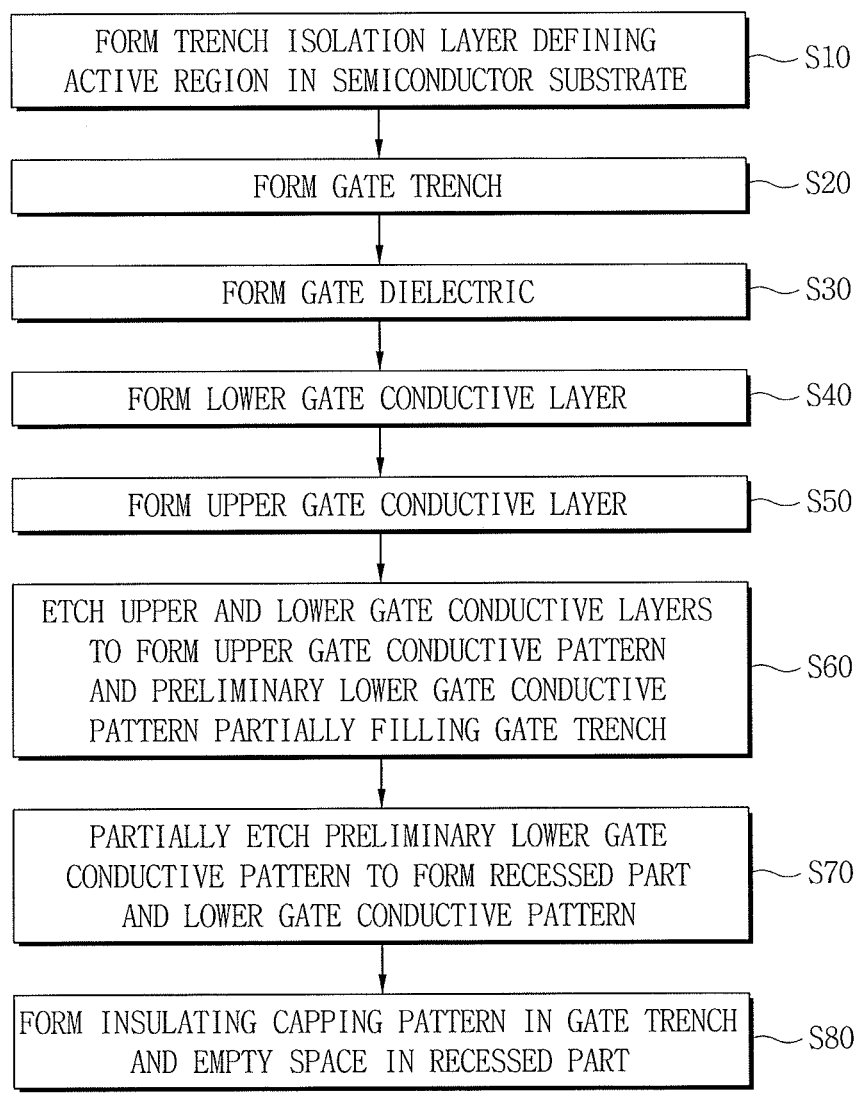
FIG. 8 illustrates a process flowchart for describing a method of fabricating a semiconductor device in accordance with embodiments.

Next, a method of fabricating a semiconductor device in accordance with embodiments will be described with reference to FIGS. 8 to 9G. FIG. 8 illustrates a process flowchart of a method of fabricating a semiconductor device in accordance with embodiments, and FIGS. 9A to 9G illustrate cross-sectional views of stages in a method of fabricating a semiconductor device in accordance with an embodiment. FIGS. 9A to 9G illustrate cross-sections along line I-I' of FIG. 1.

Figure 9A:
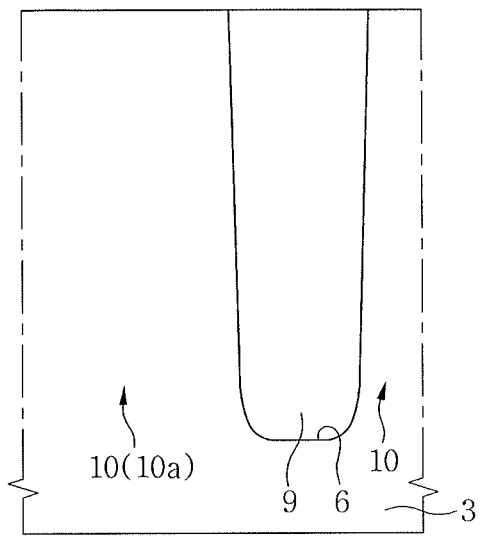
FIGS. 9A to 9G illustrate cross-sectional views of stages in a method of fabricating a semiconductor device in accordance with an embodiment.

Referring to FIGS. 8 and 9A, the semiconductor substrate 3 may be prepared. The semiconductor substrate 3 may be a substrate formed of a semiconductor material, e.g., silicon. The trench isolation layer 9 defining the active region 10 may be formed in the semiconductor substrate 3 (S10). The formation of the trench isolation layer 9 may include forming the field trench 6 defining the active region 10 in the semiconductor substrate 3, and forming an insulating material layer filling the field trench 6. The insulating material layer may include an insulating material, e.g., silicon oxide, silicon oxynitride, or silicon nitride.

Figure 9B:
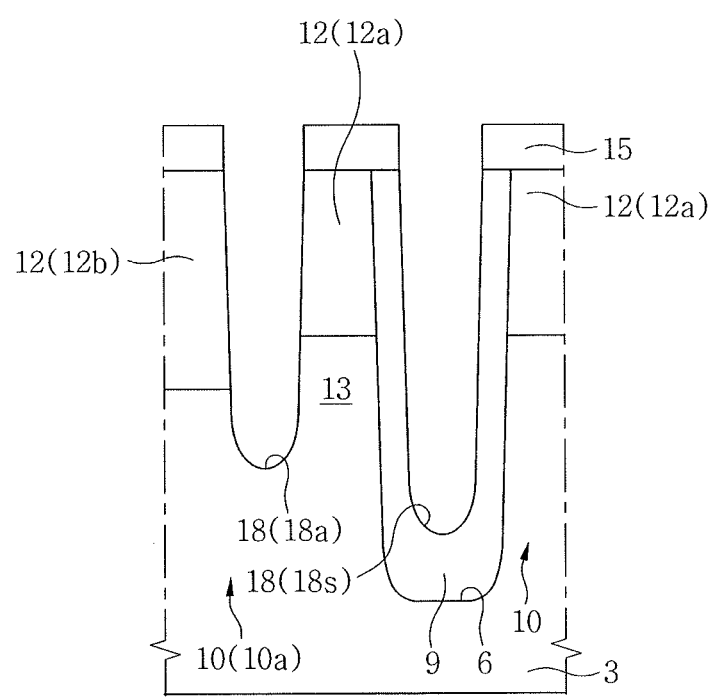

Referring to FIGS. 8 and 9B, an impurity region may be formed in the active region 10 by performing an ion-implantation process. The active region 10 may be a first conductivity type, and the impurity region may be a second conductivity type. For example, the active region 10 may have p-type conductivity, and the impurity region may have n-type conductivity.

The gate trench 18 crossing the active region 10 may be formed (S20). The gate trench 18 may cross the active region 10 and extend into the trench isolation layer 9. In the gate trench 18, a bottom surface of a part disposed in the active region 10 may be located at a lower level than a bottom surface of a part disposed in the trench isolation layer 9.

The formation of the gate trench 18 may include forming a gate mask 15 crossing the active region 10 and extending into the trench isolation layer 9, and etching the active region 10 and the trench isolation layer 9 using the gate mask 15 as an etch mask.

The gate trench 18 may include the first gate trench 18a and the second gate trench 18b parallel to each other. The first gate trench 18a may cross the active region 10a among the active regions 10, and the second gate trench 18s may be formed in the trench isolation layer 9 adjacent to the active region 10a.

The impurity region may be separated by the gate trench 18 to form the source/drain regions 12 spaced apart from each other. The source/drain regions 12 may include the first source/drain region 12a and the second source/drain region 12b formed in the active region 10a. The channel area 13 may be formed in the active region 10a under the source/drain regions 12.

The source/drain regions 12 may include the first source/drain region 12a and the second source/drain region 12b having different junction depths, i.e., an asymmetrical structure. However, embodiments are not limited thereto, and a symmetrical structure of source/drain regions 12 may be formed.

Figure 9C:
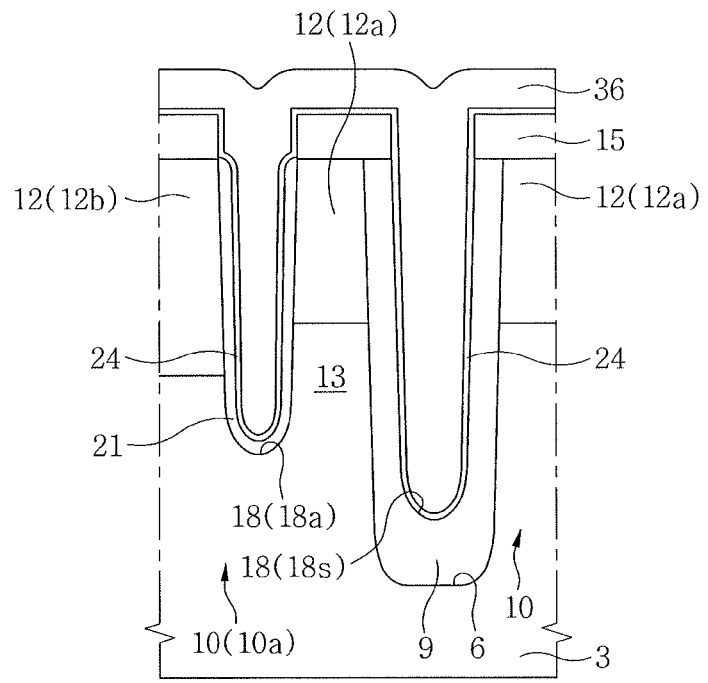

Referring to FIGS. 8 and 9C, the gate dielectric 21 may be formed on the gate trench 18 (S30). The gate dielectric 21 may be formed on the active region 10 exposed by the gate trench 18 using a thermal oxidation process. The gate dielectric 21 may be formed of silicon oxide using the thermal oxidation process. In some embodiments, the gate dielectric 21 may be formed by a deposition method, e.g., an ALD process.

The lower gate conductive layer 24 may be formed on the substrate having the gate dielectric 21 (S30). The lower gate conductive layer 24 may be conformally formed on the substrate having the gate dielectric 21.

The upper gate conductive layer 36 filling the gate trench 18 may be formed on the lower gate conductive layer 24 (S50). The upper gate conductive layer 36 may be formed of a material having an etch selectivity with respect to the lower gate conductive layer 24. For example, the lower gate conductive layer 24 may be formed of silicon or a metal nitride, e.g., TiN, WN, TiSiN, or TaN, and the upper gate conductive layer 36 may be formed of a metal material, e.g., W.

Figure 9D:
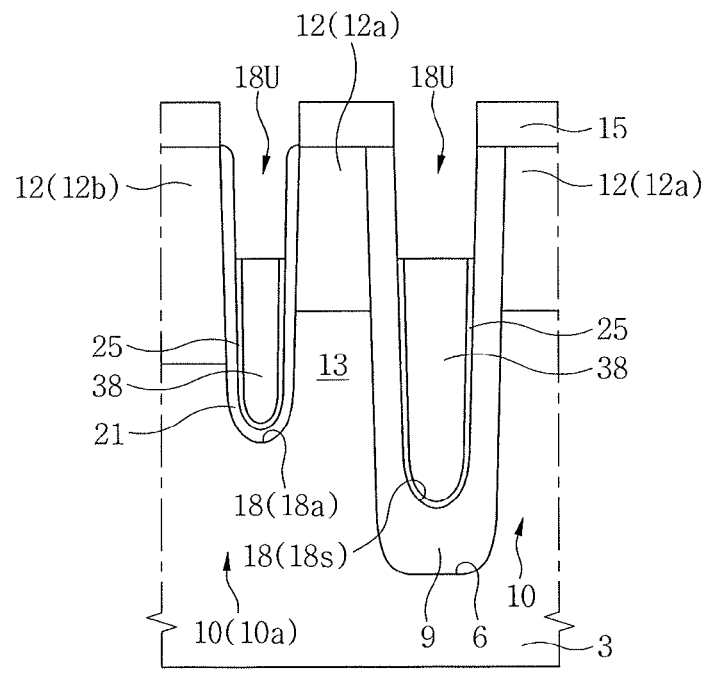

Referring to FIGS. 8 and 9D, the upper gate conductive layer (reference numeral 36 in FIG. 9C) and the lower gate conductive layer (reference numeral 24 in FIG. 9C) may be etched to form the upper gate conductive pattern 38 and preliminary lower gate conductive pattern 25 partially filling the gate trench 18 (S60). By partially etching the upper gate conductive layer (reference numeral 36 in FIG. 9C) and the lower gate conductive layer (reference numeral 24 in FIG. 9C), an upper part 18U of the gate trench 18 may be opened.

Figure 9E:
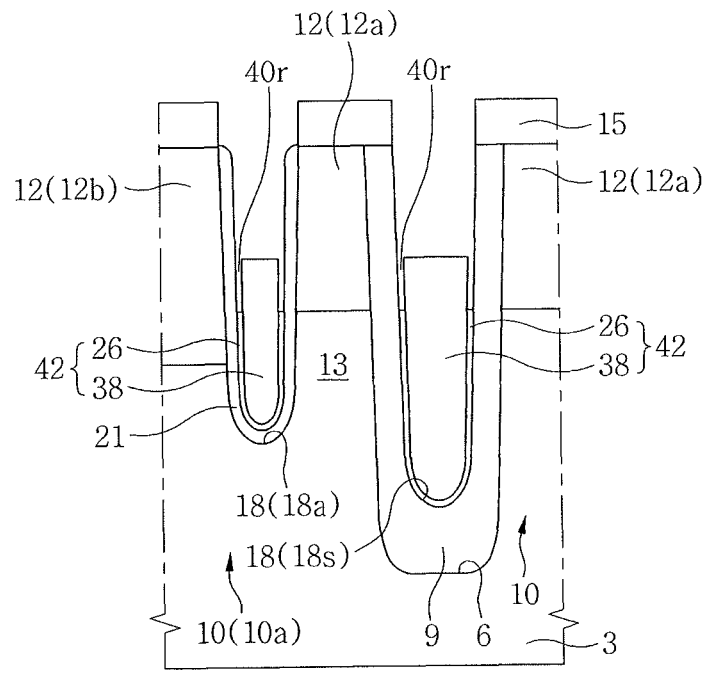

Referring to FIGS. 8 and 9E, the preliminary lower gate conductive pattern (reference numeral 25 in FIG. 9D) may be partially etched to form a recessed part 40r and the lower gate conductive pattern 26 (S70). The recessed part 40r may expose an upper side surface of the upper gate conductive pattern 38. The preliminary lower gate conductive pattern (reference numeral 25 in FIG. 9D) may be partially etched using a wet etch process.

Figure 9F:
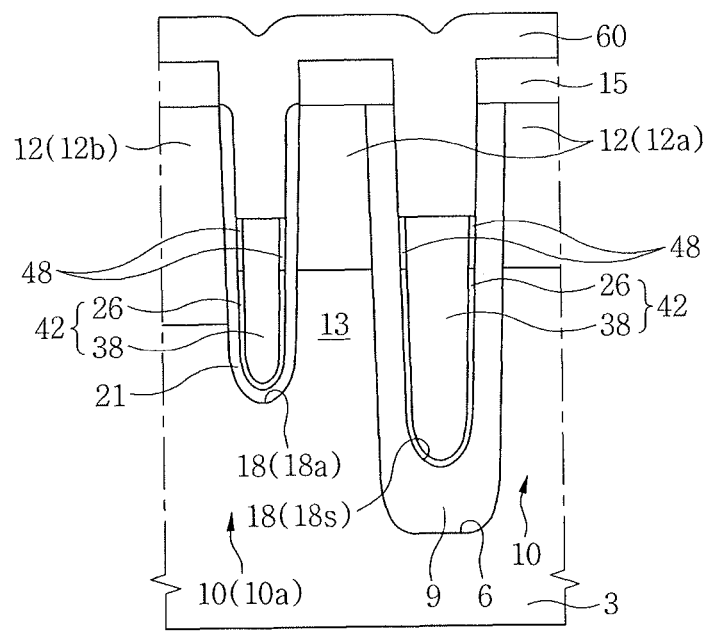
Figure 9G:
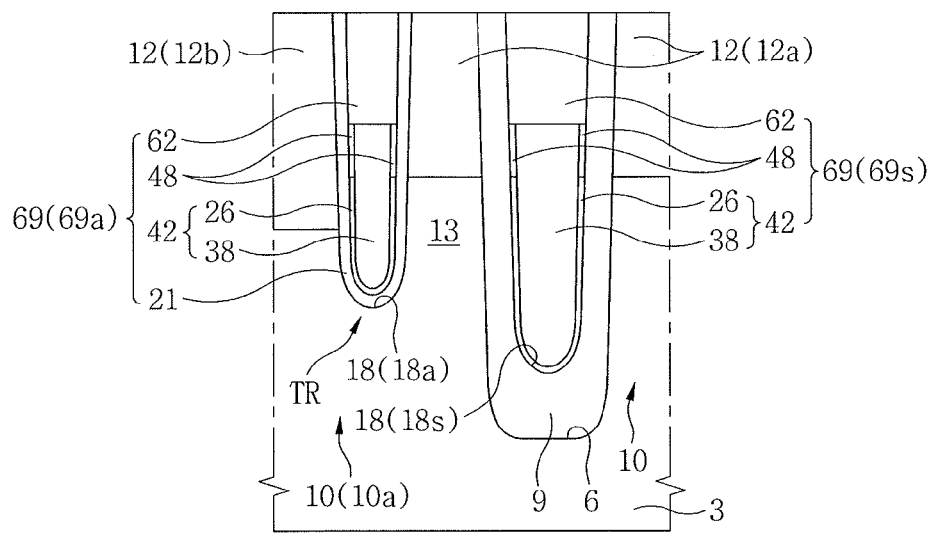

Referring to FIGS. 8, 9F, and 9G, the insulating capping pattern 62 may be formed in the gate trench 18, and the empty space 48 may be formed in the recessed part (reference numeral 40r in FIG. 9E) (S80).

The formation of the insulating capping pattern 62 may include forming an insulating capping layer 60 on the substrate having the recessed part 40r, and planarizing the insulating capping layer 60. The insulating capping layer 60 may be formed of an insulating material, e.g., silicon nitride, using a chemical vapor deposition (CVD) process. The gate mask 15 may be removed during or after planarizing the insulating capping layer 60.

The insulating capping layer 60 may be formed of an insulating material which does not fill the recessed part 40r but fills the upper part 18U of the gate trench 18. For example, the insulating capping layer 60 may be formed of silicon nitride by a deposition method, so the silicon nitride material is not inserted into the recessed part 40r, e.g., the silicon nitride material is only deposited above the recessed part 40r during the deposition process due to a small width of the recessed part 40r or its high aspect ratio. Therefore, the empty space 48 is formed, e.g., defined, in such a way that a top of the recessed part 40r is covered by the insulating capping layer 60. In some embodiments, as described in reference to FIG. 4B, the empty space 148 may be foamed by forming an insulating capping layer to expose a part of the gate dielectric 21 located at a higher level than the gate electrode 42.

The gate dielectric 21, the gate electrode 42, the insulating capping pattern 62, and the empty space 48 may configure the gate structure 69. Therefore, the gate structure 69 as described in reference to FIG. 2A may be formed.

Next, referring to FIG. 2A, the lower insulating layer 82 may be formed on the substrate having the gate structure 69, and the bit line structure 84 electrically connected to the second source/drain region 12b may be formed on the lower insulating layer 82. The bit line structure 84 may include a bit line plug 84p passing through the lower insulating layer 82 and physically connected to the second source/drain region 12b, and a bit line 84b formed on the lower insulating layer 82 and overlapping the bit line plug 84p. The upper insulating layer 86 may be formed on the substrate having the bit line structure 84. The contact structure 88 passing through the upper insulating layer 86 and electrically connected to the first source/drain region 12a may be formed.

The information storage element 96 electrically connected to the contact structure 88 may be formed on the upper insulating layer 86. For example, when the information storage element 96 is a capacitor of a memory device, e.g., a DRAM, the formation of the information storage element 96 may include forming the first electrode 90 electrically connected to the contact structure 88, forming the storage dielectric 92 on the first electrode 90, and forming the second electrode 94 on the storage dielectric 92.

Figure 10A:
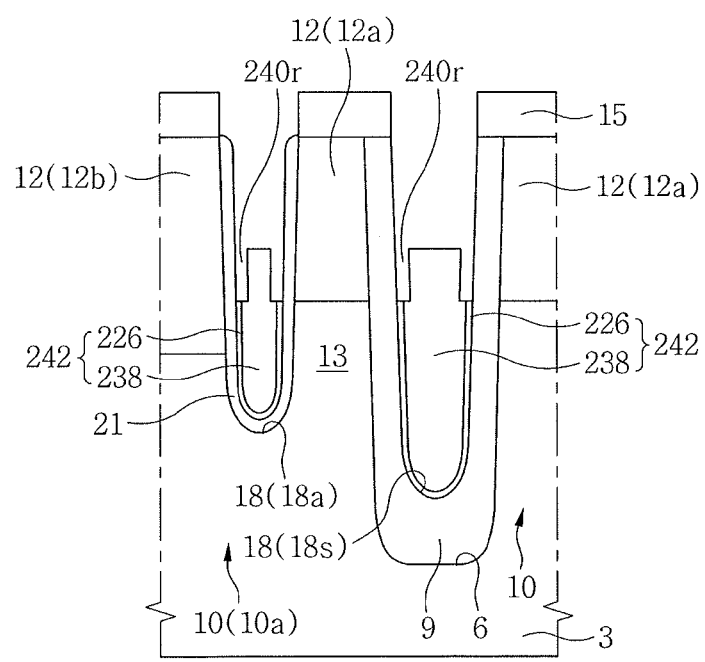
FIGS. 10A to 10C illustrate cross-sectional views of stages in a method of fabricating a semiconductor device in accordance with another embodiment.
Figure 10B:
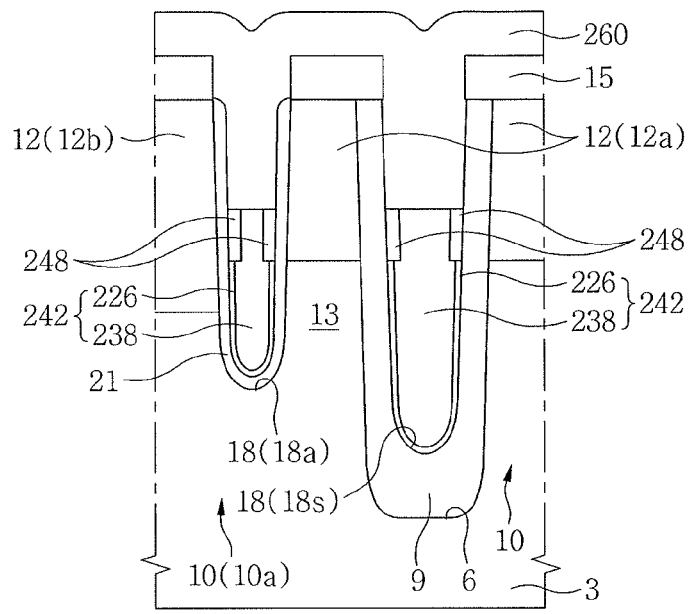
Figure 10C:
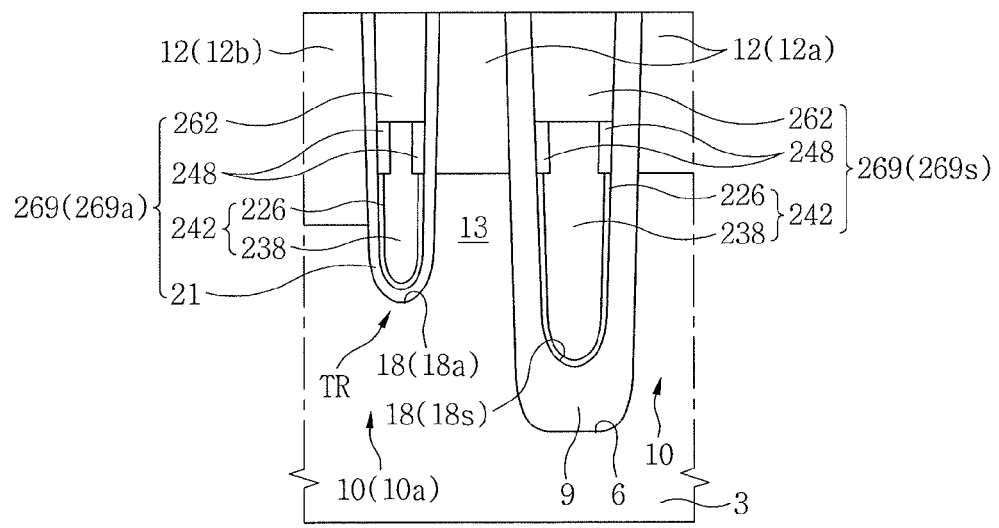

Next, a method of fabricating a semiconductor device in accordance with another embodiment will be described with reference to FIGS. 10A to 10C. FIGS. 10A to 10C illustrate cross-sectional views along line I-I' of FIG. 1.

Referring to FIG. 10A, a substrate having the upper gate conductive pattern (reference numeral 38 in FIG. 9D) and the preliminary lower gate conductive pattern (reference numeral 25 in FIG. 9D) may be formed using the same method as described in FIGS. 9A to 9D.

The preliminary lower gate conductive pattern (reference numeral 25 in FIG. 9D) may be partially etched and recessed to form a lower gate conductive pattern 226. In addition, in order to increase the width of the recessed part formed by partially etching the preliminary lower gate conductive pattern (reference numeral 25 in FIG. 9D), the upper gate conductive pattern (reference numeral 38 in FIG. 9D) may be partially etched using an isotropic etching process to form an upper gate conductive pattern 238 having a reduced upper width. Accordingly, a recessed part 240r may be formed by partially etching the preliminary lower gate conductive pattern (reference numeral 25 in FIG. 9D) and the upper gate conductive pattern (reference numeral 38 in FIG. 9D). The recessed part 240r may have a greater width than the lower gate conductive pattern 226.

Referring to FIGS. 10B and 10C, an insulating capping pattern 262 may be formed in the gate trench 18, and the empty space 248 may be formed in the recessed part (reference numeral 240r in FIG. 10A).

The formation of the insulating capping pattern 262 may include forming the insulating capping layer 260 on the substrate having the recessed part (reference numeral 240r in FIG. 10A), and planarizing the insulating capping layer 260. The gate mask 15 may be removed during or after planarizing the insulating capping layer 260.

The insulating capping layer 260 may be formed of an insulating material, e.g. SiN, which does not fill the recessed part 240r but fills an upper part of the gate trench 18. The empty space 248 may be formed in such a way that the top of the recessed part (reference numeral 240r in FIG. 10A) is covered by the insulating capping layer 260.

The gate dielectric 21, the gate electrode 242, the insulating capping pattern 262, and the empty space 248 may configure a gate structure 269. Therefore, the gate structure 269 as described in FIG. 5 may be formed.

Next, a method of fabricating a semiconductor device in accordance with still another embodiment will be described with reference to FIGS. 11A to 11E. FIGS. 11A to 11E illustrate cross-sectional views along line I-I' of FIG. 1.

Figure 11A:
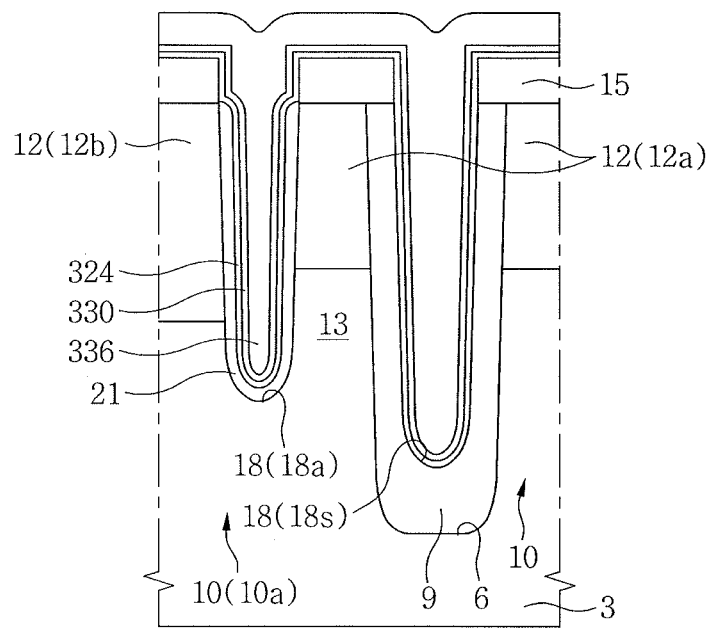
FIGS. 11A to 11E illustrate cross-sectional views of stages in a method of fabricating a semiconductor device in accordance with still another embodiment.

Referring to FIG. 11A, a substrate having the gate trench 18 may be formed using the same method as described in FIGS. 9A and 9B. The gate dielectric 21 as described in reference to FIG. 9C may be formed on the substrate having the gate trench 18.

A lower gate conductive layer 324, an intermediate gate conductive layer 330, and an upper gate conductive layer 336 may be formed on the substrate having the gate dielectric 21. The lower gate conductive layer 324 and the intermediate gate conductive layer 330 may be conformally formed. The upper gate conductive layer 336 may be formed to fill the gate trench 18 on the intermediate gate conductive layer 330.

The lower gate conductive layer 324 may be formed of a material having an etch selectivity with respect to the intermediate gate conductive layer 330 and the upper gate conductive layer 336. For example, the lower gate conductive layer 324 may be formed of silicon, and the intermediate gate conductive layer 330 and the upper gate conductive layer 336 may be formed of a metal material. The lower gate conductive layer 324 may be formed of doped polysilicon, the intermediate gate conductive layer 330 may be formed of a metal nitride, e.g., TiN, WN, TiSiN, or TaN, and the upper gate conductive layer 336 may be formed of a metal material, e.g., W. The lower gate conductive layer 324 may be polysilicon doped with a Group V element, e.g., phosphorus.

Figure 11B:
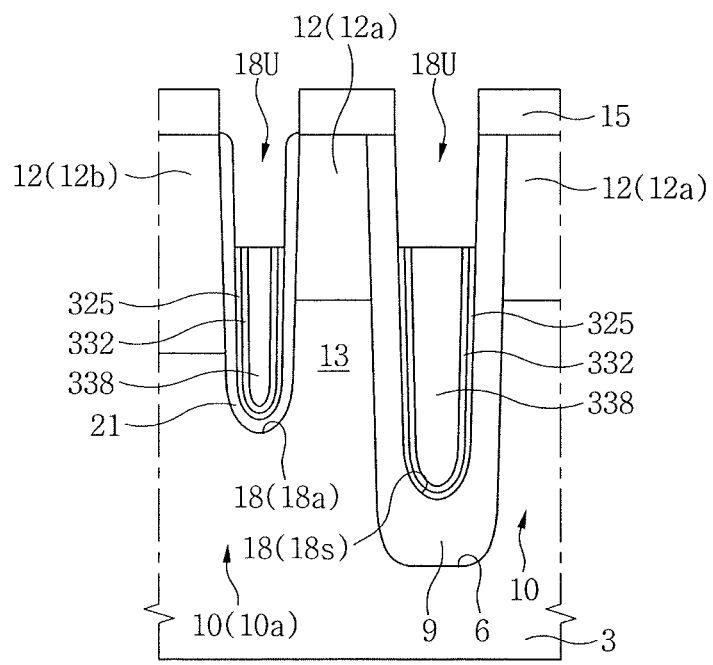

Referring to FIG. 11B, the upper gate conductive layer 336, the intermediate gate conductive layer 330, and the lower gate conductive layer 324 may be partially etched to form an upper gate conductive pattern 338, an intermediate gate conductive pattern 332, and a preliminary lower gate conductive pattern 325 which partially fill the gate trench 18. An upper part 18U of the gate trench 18 may be opened.

Figure 11C:
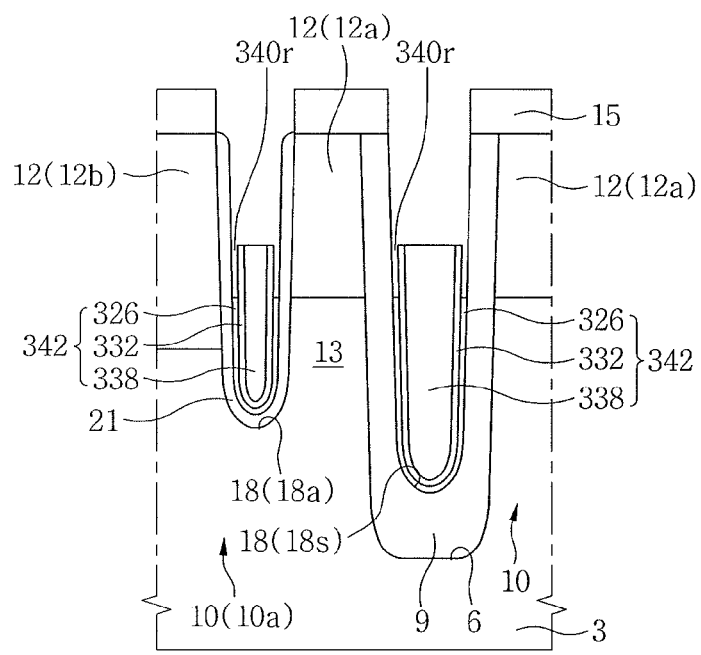

Referring to FIG. 11C, the preliminary lower gate conductive pattern 325 may be selectively partially etched to form a recessed part 340r and a lower gate conductive pattern 326. The lower gate conductive pattern 326 may be located at a lower level than upper surfaces of the upper gate conductive pattern 338 and the intermediate gate conductive pattern 332.

Figure 11D:
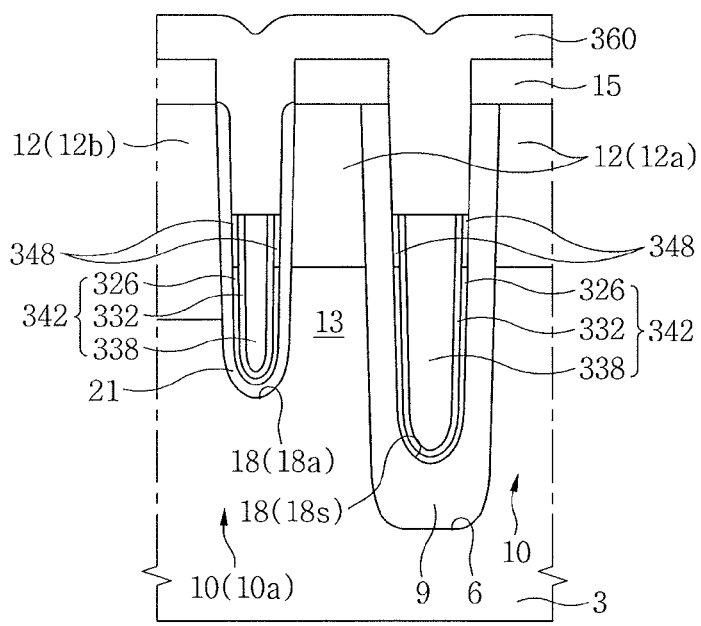
Figure 11E:
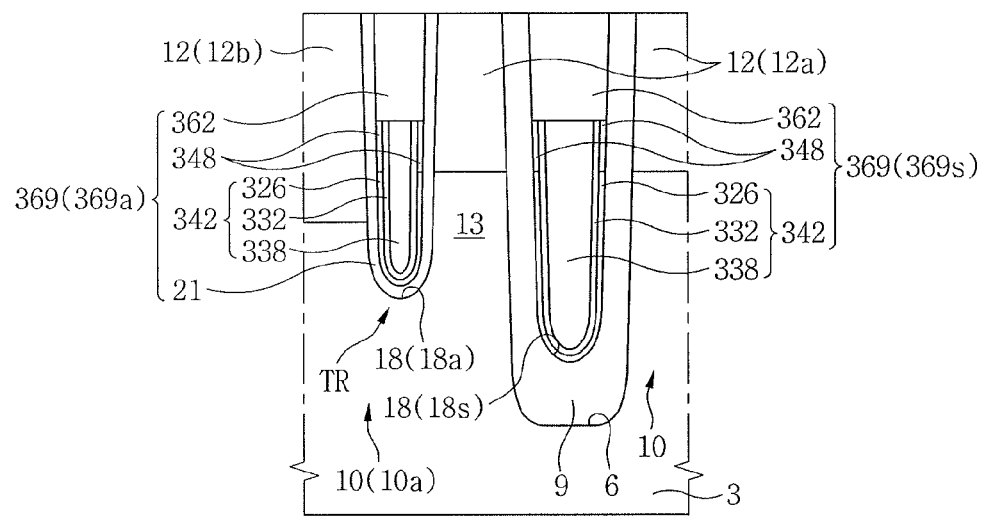

Referring to FIGS. 11D and 11E, the insulating capping pattern 362 may be formed in the gate trench 18, and the empty space 348 may be formed in the recessed part (reference numeral 340r in FIG. 11C).

The formation of the insulating capping pattern 362 may include forming the insulating capping layer 360 on the substrate having the recessed part (reference numeral 340r in FIG. 11C), and planarizing the insulating capping layer 360. The gate mask 15 may be removed during or after planarizing the insulating capping layer 360.

The insulating capping layer 360 may be formed of an insulating material, e.g. SiN, which does not fill the recessed part (reference numeral 340r in FIG. 11C) but fills an upper part of the gate trench 18. The empty space 348 may be formed in such a way that the top of the recessed part (reference numeral 340r in FIG. 11C) is covered by the insulating capping layer 360.

The gate dielectric 21, the gate electrode 342, the insulating capping pattern 362, and the empty space 348 may configure a gate structure 369. Accordingly, the gate structure 369 as described in FIG. 6A may be formed.

Figure 12A:
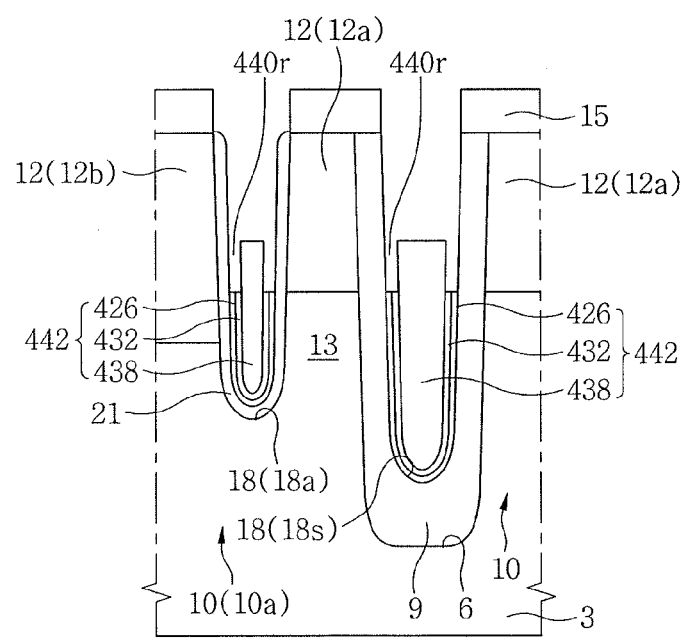
FIGS. 12A to 12C illustrate cross-sectional views of stages in a method of fabricating a semiconductor device in accordance with still another embodiment.
Figure 12B:
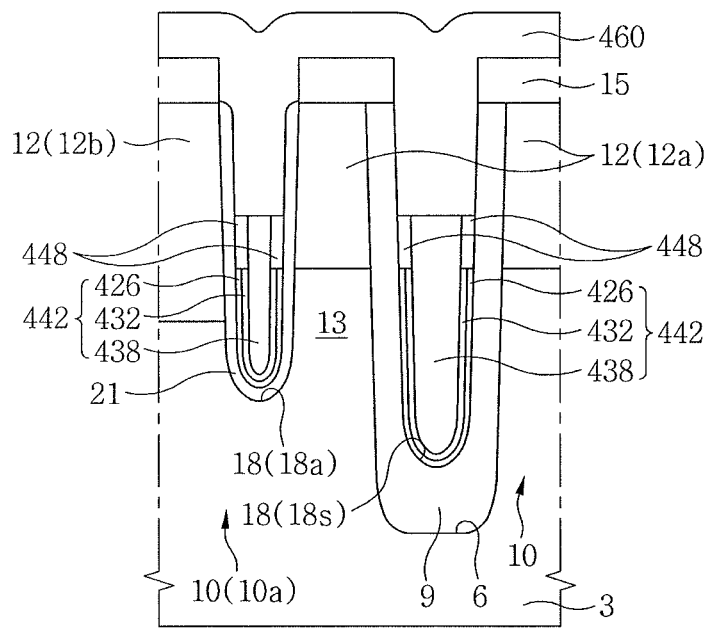
Figure 12C:
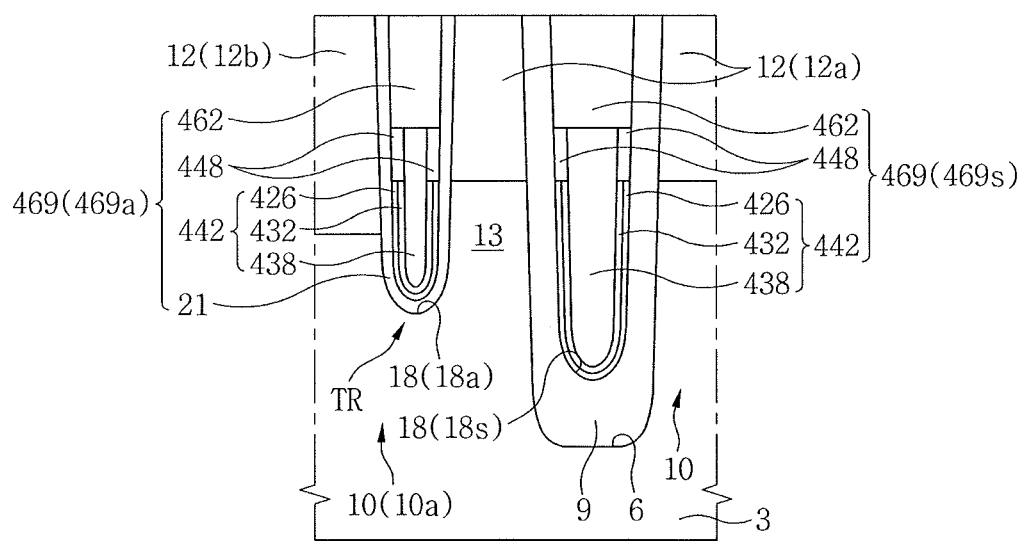

Next, a method of fabricating a semiconductor device in accordance with still another embodiment will be described with reference to FIGS. 12A to 12C. FIGS. 12A to 12C illustrate cross-sectional views along line I-I' of FIG. 1.

Referring to FIG. 12A, the lower gate conductive layer (reference numeral 324 in FIG. 11A), the intermediate gate conductive layer (reference numeral 330 in FIG. 11A), and the upper gate conductive layer (reference numeral 336 in FIG. 11A) may be formed using the same method as described in reference to FIG. 11A. The upper gate conductive layer (reference numeral 336 in FIG. 11A), the intermediate gate conductive layer (reference numeral 330 in FIG. 11A), and the lower gate conductive layer (reference numeral 324 in FIG. 11A) may be partially etched to form an upper gate conductive pattern 438, a preliminary intermediate gate conductive pattern, and a preliminary lower gate conductive pattern. The preliminary intermediate gate conductive pattern and the preliminary lower gate conductive pattern may be partially etched to form a recessed part 440r, an intermediate gate conductive pattern 432, and a lower gate conductive pattern 424. An upper side surface of the upper gate conductive pattern 438 of the recessed part 440r may be exposed.

Referring to FIGS. 12B and 12C, the insulating capping pattern 462 may be formed in the gate trench 18, and an empty space 448 may be formed in the recessed part (reference numeral 440r in FIG. 12A)

The formation of the insulating capping pattern 462 may include forming an insulating capping layer 460 on the substrate having the recessed part (reference numeral 440r in FIG. 12A), and planarizing the insulating capping layer 460. The gate mask 15 may be removed during or after planarizing the insulating capping layer 460.

The insulating capping layer 460 may be formed of an insulating material, e.g. SiN, which does not fill the recessed part (reference numeral 440r in FIG. 12A) but fills an upper part of the gate trench 18. The empty space 448 may be formed in such a way that the top of the recessed part (reference numeral 440r in FIG. 12A) is covered by the insulating capping layer 460.

The gate dielectric 21, the gate electrode 442, the insulating capping pattern 462, and the empty space 448 may configure a gate structure 469. Accordingly, the gate structure 469 as described in FIG. 7 may be formed.

EXAMPLE

When an empty space is formed as shown in the embodiments, the physical thickness and effective thickness of a gate dielectric of a transistor according to the thickness variation of the empty space will be described with reference to Table 1 below, as well as FIGS. 3 and 13.

TABLE 1

|  | Gate Dielectric thickness T1 | Empty Space thickness T2 | Physical thickness ($T_{phy}$) | Effective thickness ($T_{eff}$) |
|---|---|---|---|---|
| Sample 1 | 50 Å | about 10 Å | about 60 Å | about 100 Å |
| Sample 2 | 50 Å | about 20 Å | about 70 Å | about 140 Å |
| Sample 3 | 50 Å | about 30 Å | about 80 Å | about 180 Å |

Sample 1, Sample 2, and Sample 3 have the same structure as described in reference to FIG. 3. That is, Sample 1, Sample 2, and Sample 3 include the gate dielectric 21 and the empty space 48 interposed between the active region 10 and the gate electrode 42. The gate dielectric 21 may be in contact with the active region 10, and the empty space 48 may be interposed between the gate dielectric 21 and the gate electrode 42. Sample 1, Sample 2, and Sample 3 are samples formed by changing the thickness T2 of the empty space 48 while keeping the thickness T1 of the gate dielectric 21 constant.

Figure 13:
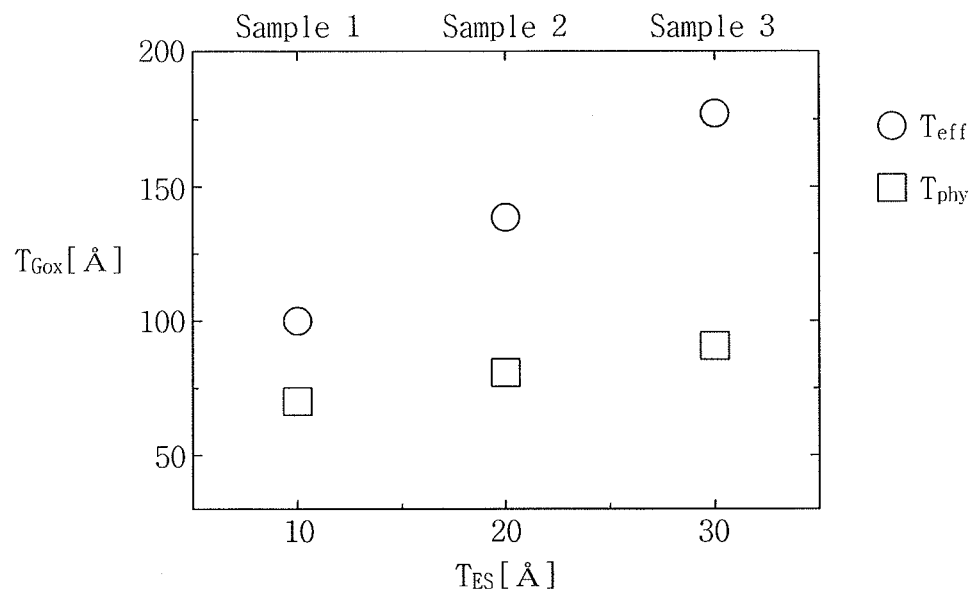
FIG. 13 illustrates a diagram showing an example of a semiconductor device in accordance with embodiments.

In FIG. 13, the X-axis represented by "$T_{ES}$" refers to the thickness of the empty space 48, and the Y-axis represented by "$T_{Gox}$" refers to a physical thickness ($T_{phy}$) and an effective thickness ($T_{eff}$). Here, the physical thickness ($T_{phy}$) indicates a physical oxide thickness, and the effective thickness ($T_{en}$) indicates an effective oxide thickness.

Sample 1, Sample 2, and Sample 3 are samples in which the gate dielectric 21 of FIG. 3 is formed of silicon oxide having a thickness T1 of 50 Å. In addition, Sample 1 is a sample in which the empty space 48 of FIG. 3 is formed to have a thickness T2 of about 10 Å, Sample 2 is a sample in which the empty space 48 of FIG. 3 is formed to have a thickness T2 of about 20 Å, and Sample 3 is a sample in which the empty space 48 of FIG. 3 is formed to have a thickness T2 of about 30 Å.

Therefore, sample 1 has a physical thickness ($T_{phy}$) of about 60 Å, i.e., a sum of the 50 Å (thickness of the gate dielectric 21) and the 10 Å (thickness of the empty space), and an effective thickness ($T_{eff}$) of about 100 Å. Sample 2 has a physical thickness ($T_{phy}$) of about 70 Å, and an effective thickness ($T_{eff}$) of about 140 Å. Sample 3 has a physical thickness ($T_{phy}$) of about 80 Å, and an effective thickness ($T_{eff}$) of about 180 Å.

Although Sample 1 has a physical distance between the gate electrode 42 and the active region 10, i.e., a physical thickness, of about 60 Å, an equivalent thickness of the silicon oxide, i.e., an effective silicon oxide thickness, is about 100 Å between the gate electrode 42 and the active region 10, due to the existence of the empty space 48.

In addition, it can be seen through Sample 1, Sample 2, and Sample 3 that when the thickness T2 of the empty space 48 increases by about 10 Å, the effective thickness ($T_{eff}$) increases by about 40 Å.

The gate dielectric 21 having the first thickness T1 may be interposed between the gate electrode 42 and the channel area 13 of the active region 10, and the gate dielectric 21 having the first thickness T1 and the empty space 48 having the second thickness T2 may be interposed between the gate electrode 42 and the source/drain regions 12 of the active region 10. In addition, since the effective thickness ($T_{eff}$) is greater than the physical thickness ($T_{eff}$) between the electrode 42 and the source/drain regions 12 due to the existence of the first empty space 48, GIDL current of the transistor may be reduced. Further, since the GIDL current is reduced due to the first empty space 48, the thickness of the gate dielectric 21 may be minimized. Accordingly, since the thickness of the gate dielectric 21 interposed between the gate electrode 42 and the channel area 13 in the active region 10 is minimized, operation characteristics of the transistor TR may be improved. In addition, when the transistor TR is a cell transistor of a DRAM device, refresh characteristics of the DRAM device may be improved.

Figure 14:
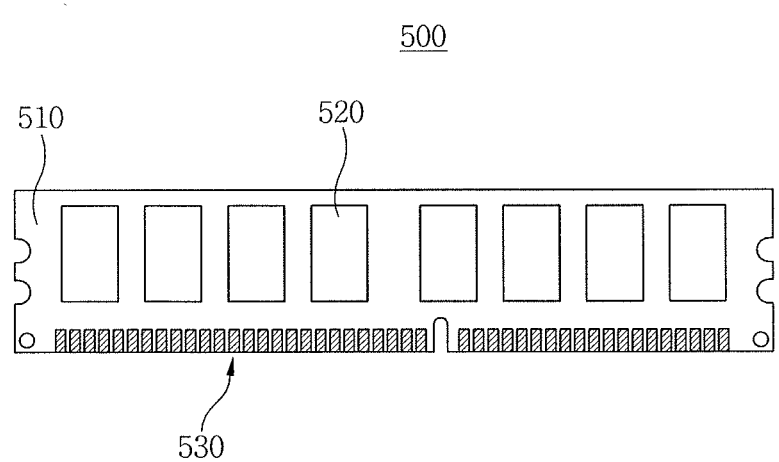
FIGS. 14 and 15 illustrate views schematically showing semiconductor modules including a semiconductor device in accordance with embodiments.

FIG. 14 illustrates a schematic diagram of a semiconductor module 500 including a semiconductor device in accordance with embodiments.

Referring to FIG. 14, the semiconductor module 500 may be a memory module including a memory device. The semiconductor module 500 may include a module substrate 510, and a plurality of semiconductor devices 520 and terminals 530 disposed on the module substrate 510. The terminals 530 may include a conductive metal. The terminals 530 may be electrically connected to the semiconductor devices 520.

The module substrate 510 may be a memory module substrate. The module substrate 510 may include a printed circuit board (PCB) or a wafer.

The semiconductor devices 520 may be memory devices. The semiconductor devices 520 may be DRAM devices. The memory devices 520 may be one of the semiconductor devices in accordance with the embodiments described with reference to FIGS. 1 to 12C, or a semiconductor package including the semiconductor device. For example, the semiconductor devices 520 may be semiconductor devices including the information storage element 96 as described in FIGS. 2A and 3.

The semiconductor devices 520 may include the trench isolation layer (reference numeral 9 in FIG. 2A) formed in the semiconductor substrate (reference numeral 3 in FIG. 2A) and defining the active region (reference numeral 10 in FIG. 2A), the first source/drain region (reference numeral 12a in FIG. 2A) and the second source/drain region (reference numeral 12b in FIG. 2A) disposed in the active region 10, the first gate structure (reference numeral 69a in FIG. 2A) disposed in the active region (reference numeral 10a in FIG. 2A) between the first and second source/drain regions, the second gate structure (reference numeral 69s in FIG. 2A) disposed in the trench isolation layer (reference numeral 9 in FIG. 2A), the information storage element (reference numeral 96 in FIG. 2A) electrically connected to the first source/drain region (reference numeral 12a in FIG. 2A), and the bit line structure (reference numeral 84 in FIG. 2A) electrically connected to the second source/drain region (reference numeral 12b in FIG. 2A).

The first gate structure 69a, as described in FIG. 2A, may include the first gate electrode 42a, the first insulating capping pattern 62a disposed on the first gate electrode 42a, the gate dielectric 21 disposed between the first gate electrode 42a and the active region 10a, and the first empty space 48a interposed between the first gate electrode 42a and the gate dielectric 21. The second gate structure 69s, as described in FIG. 2A, may include the second gate electrode 42s, the second insulating capping pattern 62s disposed on the second gate electrode 42s, and the second empty space 48s interposed between the second gate electrode 42s and the trench isolation layer 9. The first source/drain region 12a may be disposed between the first empty space 48a and the second empty space 48s.

The semiconductor devices 520 may include the gate structure 69 described in FIG. 2A, or one of the gate structures 169, 269, 369, and 469 described in FIGS. 4A to 7.

According to the embodiments, a semiconductor device including a gate structure which suppress the generation of GIDL current of a transistor, may be provided. By employing the gate structure as a cell transistor of a DRAM device, refresh characteristics of the DRAM device may be improved.

Figure 15:
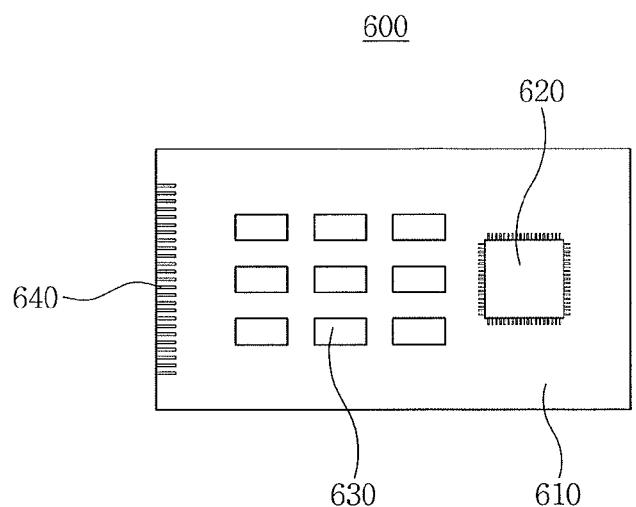

FIG. 15 illustrates a view schematically showing a semiconductor module 600 including a semiconductor device in accordance with embodiments.

Referring to FIG. 15, the semiconductor module 600 may include a semiconductor device 630 formed on a module substrate 610. The semiconductor device 630 may be a semiconductor device in accordance with one of the embodiments described with reference to FIGS. 1 to 12C, or a semiconductor package including the semiconductor device.

The semiconductor module 600 may further include a microprocessor 620 mounted on the module substrate 610.

Input/output terminals 640 may be disposed on at least one side of the module substrate 610.

The microprocessor 620 may include a transistor having one of the gate structures in accordance with one of the embodiments described with reference to FIGS. 1 to 12C.

Figure 16:
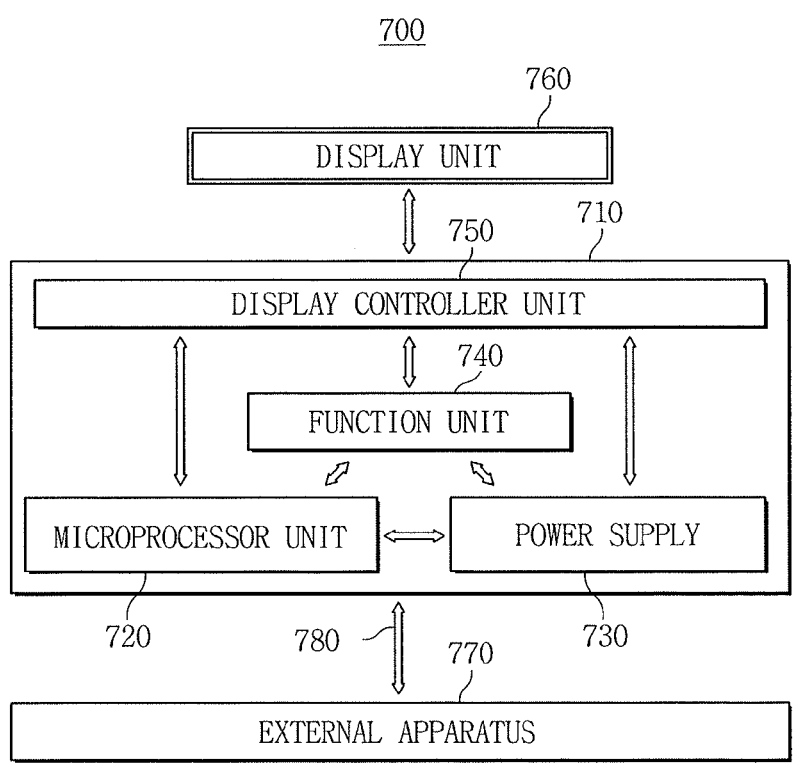
FIG. 16 illustrates a block diagram conceptually showing an electronic system including a semiconductor device in accordance with embodiments.

FIG. 16 illustrates a block diagram schematically showing an electronic system 700 including a semiconductor device in accordance with an embodiment.

Referring to FIG. 16, the electronic system 700 may include a body 710, a microprocessor unit 720, a power supply 730, a function unit 740, and/or a display controller unit 750. The body 710 may be a system board or motherboard including a printed circuit board (PCB), etc.

The microprocessor unit 720 may include a transistor having one of the gate structures in accordance with one of the embodiments described with reference to FIGS. 1 to 12C.

The microprocessor unit 720, the power supply 730, the function unit 740, and the display controller unit 750 may be mounted or installed on the body 710. A display unit 760 may be arranged on an upper surface or outside of the body 710. For example, the display unit 760 may be arranged on a surface of the body 710 and display an image processed by the display controller unit 750. The power supply 730 may receive a constant voltage from an external battery, etc., divide the voltage into various levels, and supply those voltages to the microprocessor unit 720, the function unit 740, the display controller unit 750, etc. The microprocessor unit 720 may receive a voltage from the power supply 730 to control the function unit 740 and the display unit 760.

The function unit 740 may perform various functions of the electronic system 700. For example, when the electronic system 700 is a mobile electronic apparatus such as a mobile phone, the function unit 740 may have several components which perform functions of the mobile phone, such as output of an image to the display unit 760 or output of a voice to a speaker, by dialing or communication with an external apparatus 770. If a camera is installed, the function unit 740 may function as a camera image processor.

In the embodiments, when the electronic system 700 is connected to a memory card, etc. in order to expand capacity, the function unit 740 may be a memory card controller. The function unit 740 may exchange signals with the external apparatus 770 through a wired or wireless communication unit 780.

In addition, when the electronic system 700 needs a universal serial bus (USB), etc. in order to expand functionality, the function unit 740 may function as an interface controller.

Figure 17:
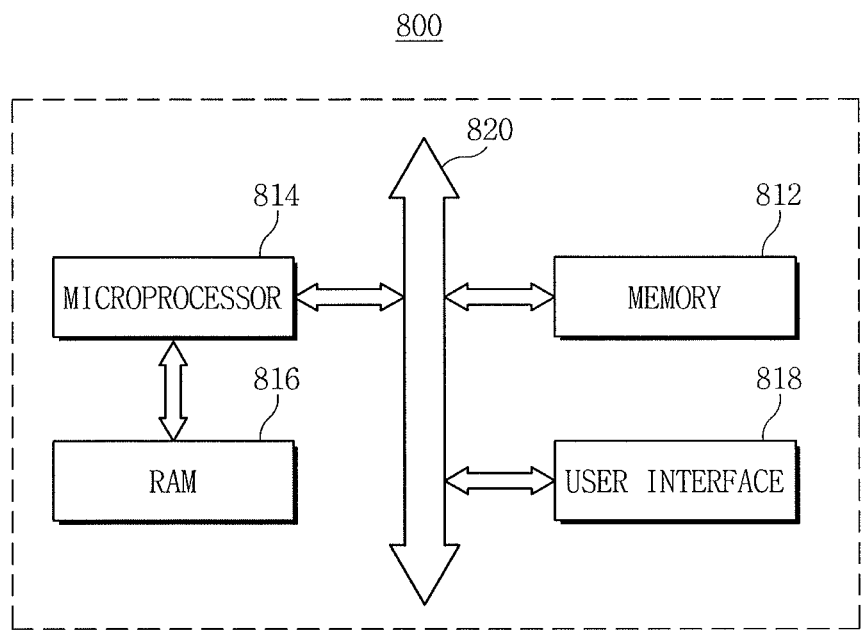
FIG. 17 illustrates a block diagram schematically showing another electronic system including a semiconductor device in accordance with embodiments.

FIG. 17 illustrates a block diagram schematically showing another electronic system 800 including a semiconductor device in accordance with an embodiment.

Referring to FIG. 17, the electronic system 800 may include a semiconductor device in accordance with embodiments. The electronic system 800 may be used to fabricate a mobile apparatus or a computer. For example, the electronic system 800 may include a memory system 812, a microprocessor 814, a random access memory (RAM) 816, and a user interface 818 performing data communication using a bus 820. The microprocessor 814, the RAM 816, and/or other components can be assembled in a single package. The microprocessor 814, the memory system 812, and/or the RAM 816 may include a transistor or semiconductor device including a gate structure in accordance with embodiments.

The user interface 818 may be used to input data to, or output data from the electronic system 800. The memory system 812 may store codes for operating the microprocessor 814, data processed by the microprocessor 814, or external input data. The memory system 812 may include a controller and a memory.

Figure 18:
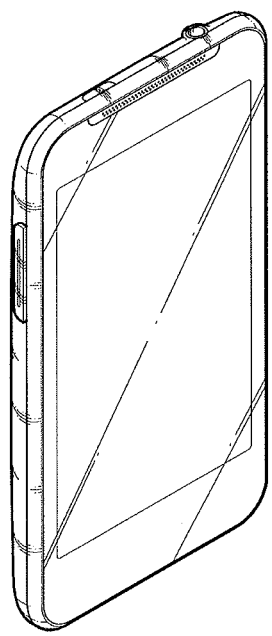
FIG. 18 illustrates a view schematically showing a mobile wireless phone including a semiconductor device in accordance with embodiments.

FIG. 18 illustrates a view schematically showing a mobile wireless phone 900 including a semiconductor device in accordance with embodiments. The mobile wireless phone 900 may include a transistor or semiconductor device including a gate structure in accordance with embodiments. The mobile wireless phone 900 may be understood as a tablet PC. Further, the semiconductor devices in accordance with an embodiment may be used in a portable computer such as a laptop computer, an MPEG-1 Audio Layer 3 (MP3) player, an MP4 player, a navigation apparatus, a solid state disk (SSD), a desktop computer, an automobile, or a home appliance, as well as the tablet PC.

By way of summary and review, according to embodiments, the effective oxide thickness, as well as the physical oxide thickness, of a tunnel oxide layer may be increased by forming an air-gap at an area in which a gate electrode overlaps the source/drain regions. Therefore, leakage current, e.g., GIDL current at the source/drain region electrically connected to a storage node of a memory device, e.g., a DRAM device, may be reduced. Further, refresh characteristics of the memory device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a first source/drain region and a second source/drain region disposed in an active region of a semiconductor substrate; and
   a gate structure crossing the active region and disposed between the first and second source/drain regions, the gate structure including:
   a gate electrode having a first part and a second part on the first part, the gate electrode being at a lower level than an upper surface of the active region,
   an insulating capping pattern on the gate electrode,
   a gate dielectric between the gate electrode and the active region, and between the insulating capping pattern and the active region, and
   an empty space between the active region and the second part of the gate electrode,
   wherein the gate electrode includes a lower gate conductive pattern and an upper gate conductive pattern,
   wherein the lower gate conductive pattern is between the gate dielectric and the upper gate conductive pattern,
   wherein an upper end portion of the lower gate conductive pattern is at a lower level than an upper surface of the upper gate conductive pattern, and
   wherein the empty space is directly on the upper end portion of the lower gate conductive pattern, and the insulating capping pattern extends to directly contact the gate dielectric to define a top of the empty space.

2. The semiconductor device as claimed in claim 1, wherein the empty space is between the gate dielectric and the second part of the gate electrode.

3. The semiconductor device as claimed in claim 1, wherein the empty space faces the first and second source/drain regions.

4. The semiconductor device as claimed in claim 1, wherein the empty space has a smaller width than a width of the gate dielectric.

5. The semiconductor device as claimed in claim 1, wherein a distance between the active region and the second part of the gate electrode is greater than a distance between the active region and the first part of the gate electrode.

6. The semiconductor device as claimed in claim 1, wherein the second part of the gate electrode has a smaller width than the first part of the gate electrode.

7. The semiconductor device as claimed in claim 1, wherein the empty space is directly between the lower gate conductive pattern and the insulating capping pattern, the empty space further being directly between the upper gate conductive pattern and the gate dielectric.

8. The semiconductor device as claimed in claim 1, wherein the lower gate conductive pattern has substantially the same thickness as the gate dielectric.

9. The semiconductor device as claimed in claim 1, further comprising an intermediate gate conductive pattern between the lower gate conductive pattern and the upper gate conductive pattern.

10. A semiconductor device, comprising:
a gate trench crossing an active region in a semiconductor substrate;
a gate electrode disposed in the gate trench;
an insulating capping pattern disposed on the gate electrode;
a gate dielectric disposed between the gate electrode and the active region, and between the insulating capping pattern and the active region; and
an empty space surrounded by the gate electrode, the insulating capping pattern, and the gate dielectric,
wherein the gate electrode includes a lower gate conductive pattern and an upper gate conductive pattern, the lower gate conductive pattern being at a lower level than an upper surface of the upper gate conductive pattern, and
wherein an upper end portion of the lower gate conductive pattern is between the gate dielectric and a lateral surface of the upper gate conductive pattern, and the insulating capping pattern extends to directly contact the gate dielectric to define a top of the empty space.

11. The semiconductor device as claimed in claim 10, wherein the empty space is surrounded by the lower gate conductive pattern, the upper gate conductive pattern, the insulating capping pattern, and the gate dielectric.

12. The semiconductor device as claimed in claim 10, wherein the empty space includes a first part interposed between the gate dielectric and the gate electrode, and a second part interposed between the gate dielectric and the insulating capping pattern.

13. The semiconductor device as claimed in claim 12, wherein the gate electrode includes a first part and a second part on the first part, the first part of the empty space being between the second part of the gate electrode and the gate dielectric.

14. A semiconductor device, comprising:
a trench isolation layer in a semiconductor substrate and defining an active region;
a first gate trench disposed in the active region;
a second gate trench disposed in the trench isolation layer;
a first source/drain region and a second source/drain region in the active region, the first and second source/drain regions being at respective sides of the first gate trench;
a first gate structure disposed in the first gate trench; and
a second gate structure disposed in the second gate trench,
wherein the first gate structure includes:
a first gate electrode,
a first insulating capping pattern disposed on the first gate electrode,
a gate dielectric between the first gate electrode and the active region, and between the first insulating capping pattern and the active region, and
a first empty space between the first source/drain region and the first gate electrode,
wherein the second gate structure includes a second gate electrode, a second insulating capping pattern, and a second empty space,
wherein the first gate electrode includes a first lower gate conductive pattern and a first upper gate conductive pattern, the first lower gate conductive pattern being at a lower level than an upper surface of the first upper gate conductive pattern,
wherein an upper end portion of the first lower gate conductive pattern is between the gate dielectric and a lateral surface of the first upper gate conductive pattern, and
wherein the first empty space is directly on the upper end portion of the first lower gate conductive pattern, and the insulating capping pattern extends to directly contact the gate dielectric to define a top of the empty space.

15. The semiconductor device as claimed in claim 14, wherein the second insulating capping pattern is disposed on the second gate electrode, and the second empty space is disposed between an upper side surface of the second gate electrode and the trench isolation layer.

16. The semiconductor device as claimed in claim 14, wherein:
the second gate electrode includes a second lower gate conductive pattern and a second upper gate conductive pattern, and
the second lower gate conductive pattern is located at a lower level than an upper surface of the second upper gate conductive pattern and disposed between the second upper gate conductive pattern and the trench isolation layer.

17. The semiconductor device as claimed in claim 16, wherein the first empty space is interposed between the first lower gate conductive pattern and the first insulating capping pattern, and between the first upper gate conductive pattern and the gate dielectric.

18. The semiconductor device as claimed in claim 16, wherein the second empty space is interposed between the second lower gate conductive pattern and the second insulating capping pattern, and between the second upper gate conductive pattern and the trench isolation layer.

19. The semiconductor device as claimed in claim 14, wherein the first source/drain region is disposed between the first gate structure and the second gate structure, and between the first insulating capping pattern and the second insulating capping pattern.

20. The semiconductor device as claimed in claim 19, wherein the first empty space is disposed between the second gate electrode and the first source/drain region, and the second empty space is disposed between the second gate electrode and the first source/drain region.

21. The semiconductor device as claimed in claim 20, further comprising:
- an information storage element electrically connected to the first source/drain region; and
- a bit line structure electrically connected to the second source/drain region.

22. A semiconductor device, comprising:
- a first source/drain region and a second source/drain region disposed in an active region of a semiconductor substrate; and
- a gate structure crossing the active region and disposed between the first and second source/drain regions, the gate structure including:
  - a gate electrode having a lower gate conductive pattern and an upper gate conductive pattern on the lower gate conductive pattern, the gate electrode being at a lower level than an upper surface of the active region,
  - an insulating capping pattern on the gate electrode,
  - a gate dielectric between the gate electrode and the active region, and between the insulating capping pattern and the active region, and
  - an empty space enclosed by the lower gate conductive pattern, the upper gate conductive pattern, the insulating capping pattern, and the gate dielectric,
- wherein the lower gate conductive pattern has a U-shape,
- wherein the lower gate conductive pattern is between the gate dielectric and the upper gate conductive pattern,
- wherein an upper end portion of the lower gate conductive pattern is at a lower level than an upper surface of the upper gate conductive pattern, and
- wherein the empty space is directly on the upper end portion of the lower gate conductive pattern, and the insulating capping pattern extends to directly contact the gate dielectric to define a top of the empty space.

23. The semiconductor device as claimed in claim 22, wherein:
- the lower gate conductive pattern partially extends along sidewalls of a trench, the upper gate conductive pattern being on the lower gate conductive pattern inside the trench and extending above an uppermost surface of the lower gate conductive pattern, and
- the empty space is between the sidewall of the trench and a portion of the upper gate conductive pattern that extends above the lower gate conductive pattern.

24. The semiconductor device as claimed in claim 23, wherein a portion of the gate dielectric is directly between the sidewall of the trench and the empty space.

25. The semiconductor device as claimed in claim 24, wherein the lower gate conductive pattern conformally overlaps a lower portion of the upper gate conductive pattern, the empty space being defined on the lower gate conductive pattern and along an upper portion of the upper gate conductive pattern.

* * * * *